(12) United States Patent
Kimura

(10) Patent No.: US 9,286,985 B2
(45) Date of Patent: Mar. 15, 2016

(54) SEMICONDUCTOR DEVICE WITH POWER MODE TRANSITIONING OPERATION

(71) Applicant: KABUSHIKI KAISHA TOSHIBA, Minato-ku (JP)

(72) Inventor: Naoki Kimura, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 116 days.

(21) Appl. No.: 13/926,265

(22) Filed: Jun. 25, 2013

(65) Prior Publication Data

US 2014/0226400 A1 Aug. 14, 2014

Related U.S. Application Data

(60) Provisional application No. 61/763,616, filed on Feb. 12, 2013.

(51) Int. Cl.
*G06F 12/02* (2006.01)
*G11C 16/10* (2006.01)
*G06F 1/32* (2006.01)

(52) U.S. Cl.
CPC .............. *G11C 16/10* (2013.01); *G06F 1/3225* (2013.01); *G06F 1/3275* (2013.01); *G06F 1/3287* (2013.01)

(58) Field of Classification Search
CPC ............ G06F 2212/214; G06F 1/3275; G06F 1/3287; G06F 12/0868; G06F 11/1441; Y02B 60/1225

USPC .................. 713/320, 323, 324; 711/E12.001, 711/E12.008

See application file for complete search history.

(56) References Cited

U.S. PATENT DOCUMENTS

| | | | |
|---|---|---|---|
| 8,473,760 B2 * | 6/2013 | Takeyama et al. ............. | 713/300 |
| 8,788,777 B2 * | 7/2014 | Zaarur et al. ................... | 711/165 |
| 2010/0169687 A1 | 7/2010 | Kimura | |
| 2011/0231687 A1 * | 9/2011 | Takeyama et al. ............. | 713/324 |
| 2011/0238928 A1 | 9/2011 | Abe et al. | |
| 2012/0284475 A1 * | 11/2012 | Zaarur .......................... | 711/165 |
| 2013/0159785 A1 * | 6/2013 | Hashimoto ................... | 714/47.2 |

FOREIGN PATENT DOCUMENTS

| | | |
|---|---|---|
| JP | 2010-152853 | 7/2010 |
| JP | 2011-203905 | 10/2011 |
| JP | 2012-38212 | 2/2012 |

* cited by examiner

*Primary Examiner* — Han Yang
*Assistant Examiner* — Xiaochun L Chen
(74) *Attorney, Agent, or Firm* — Oblon, McClelland, Maier & Neustadt, L.L.P.

(57) ABSTRACT

According to one embodiment, a semiconductor device includes a nonvolatile memory, a volatile memory, and a controller. The controller is configured to transition a part of the volatile memory to a self-refresh mode when a request for stopping supplying of power to the nonvolatile memory is received.

8 Claims, 20 Drawing Sheets

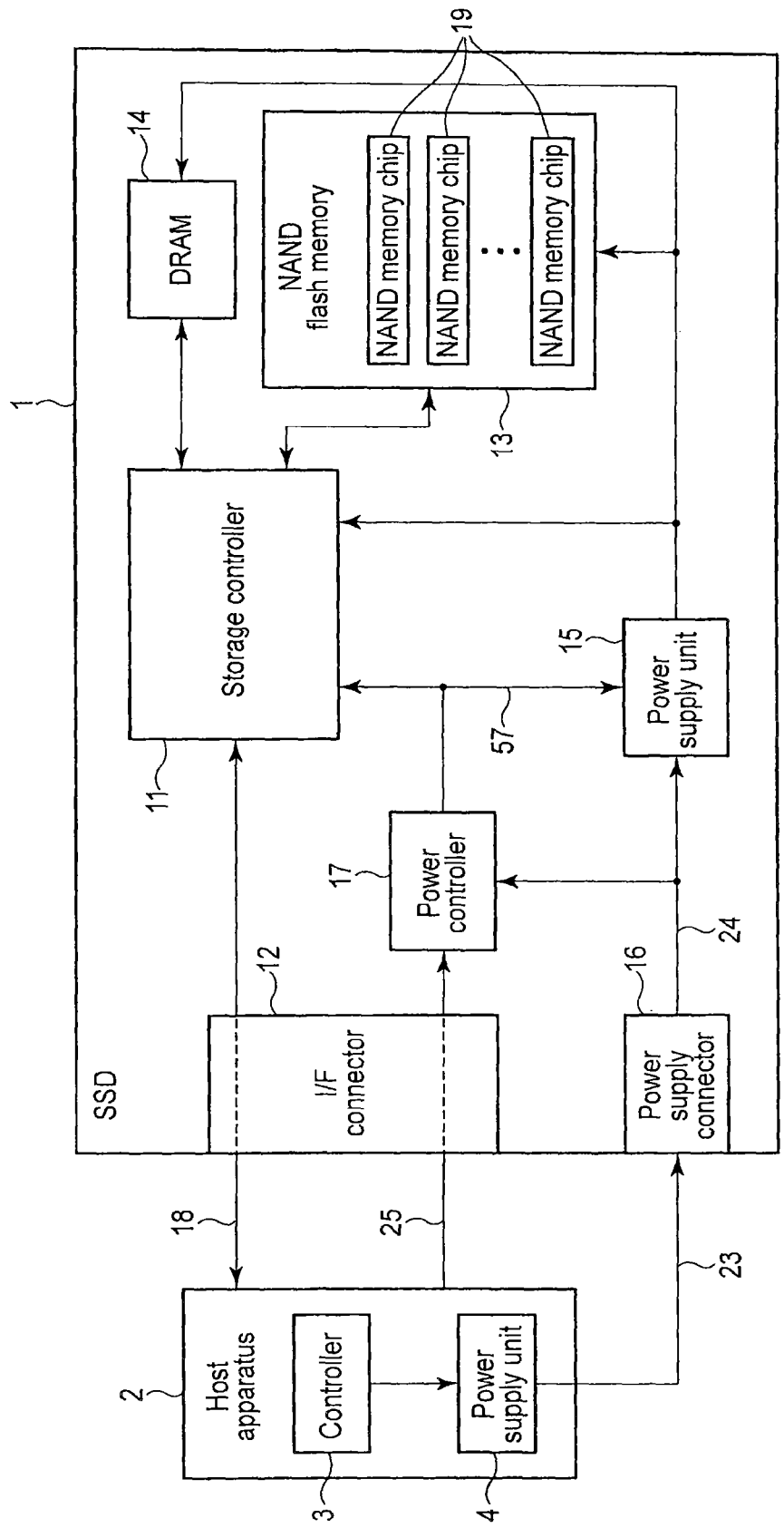
F I G. 1

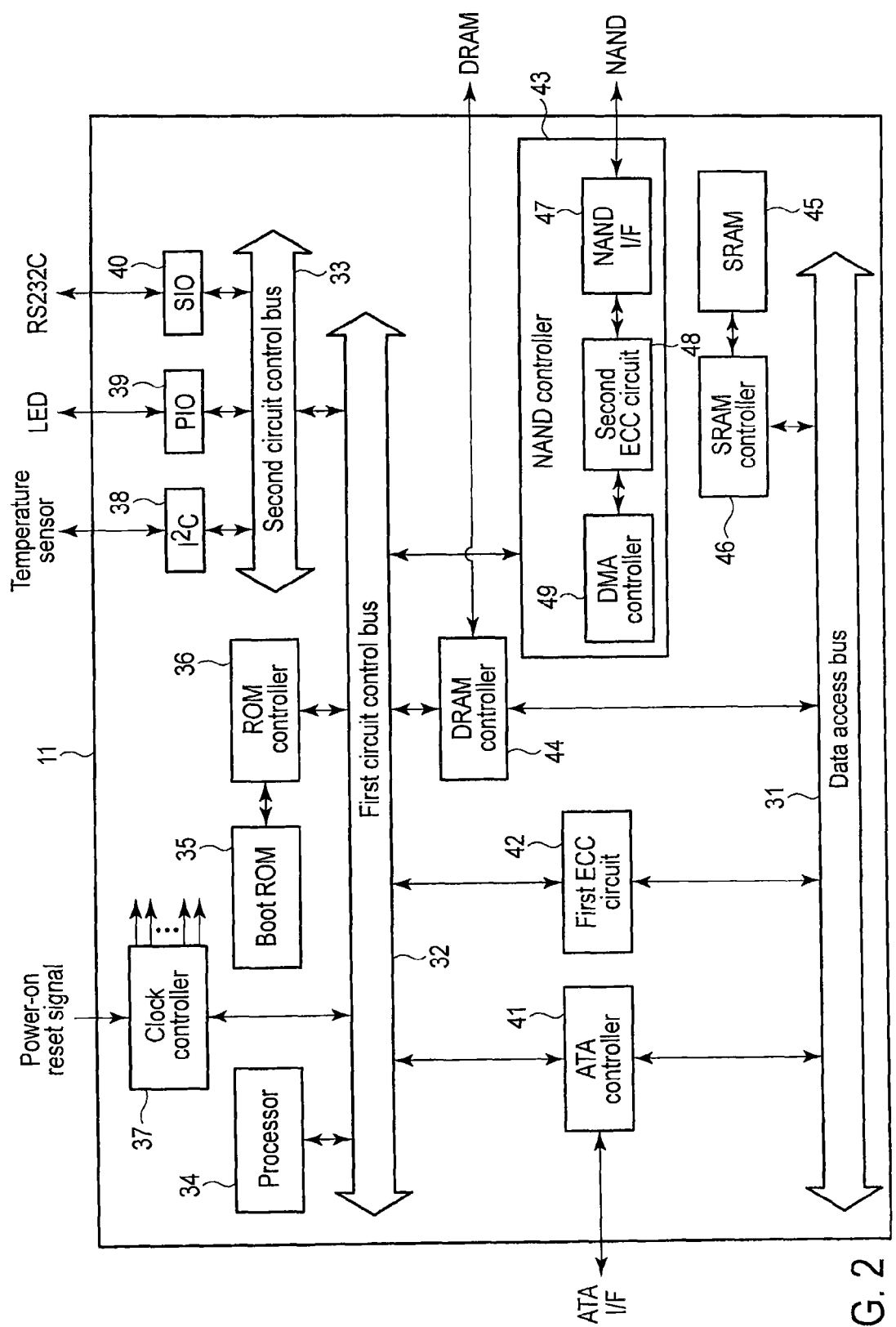
F I G. 2

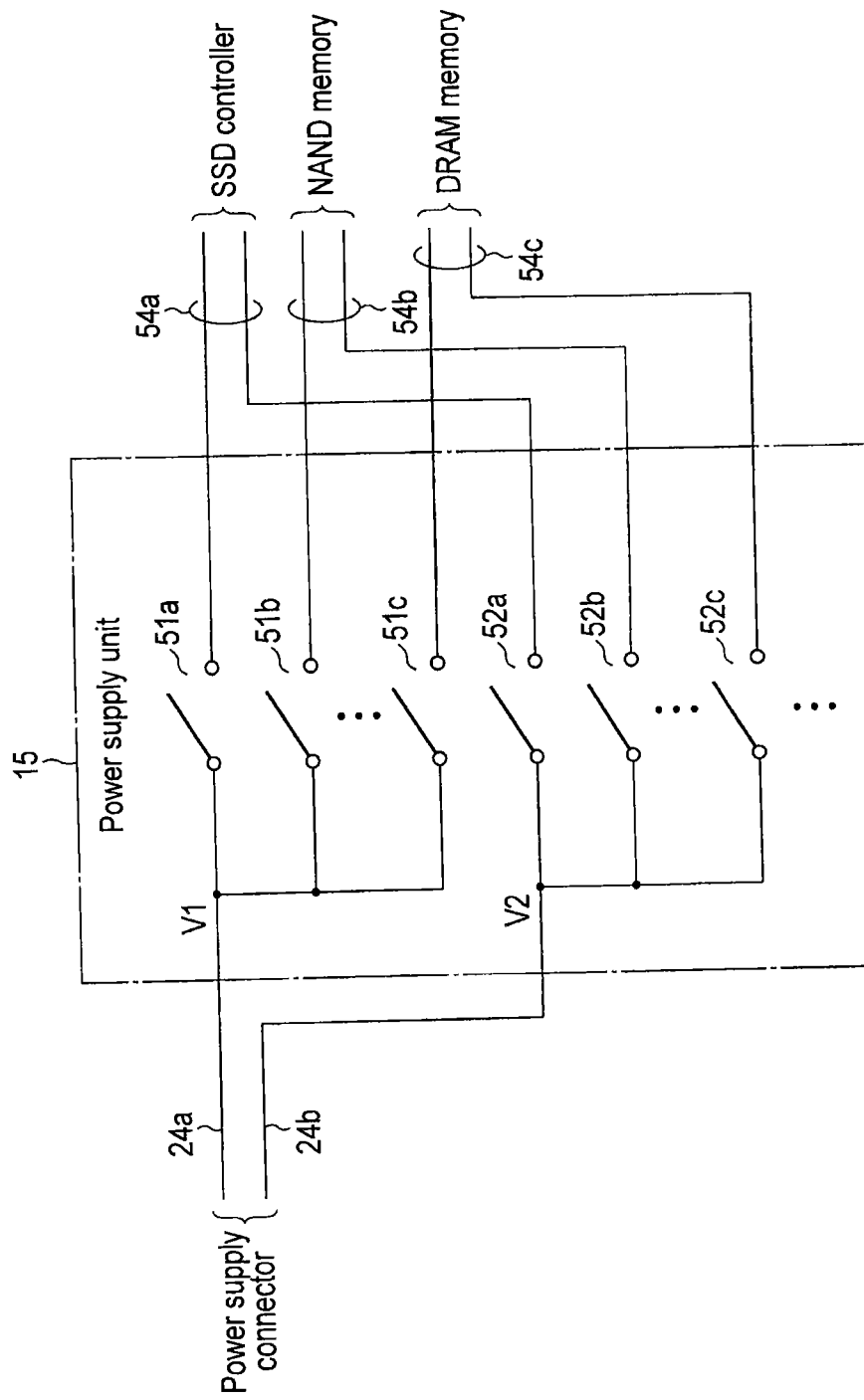
F I G. 3

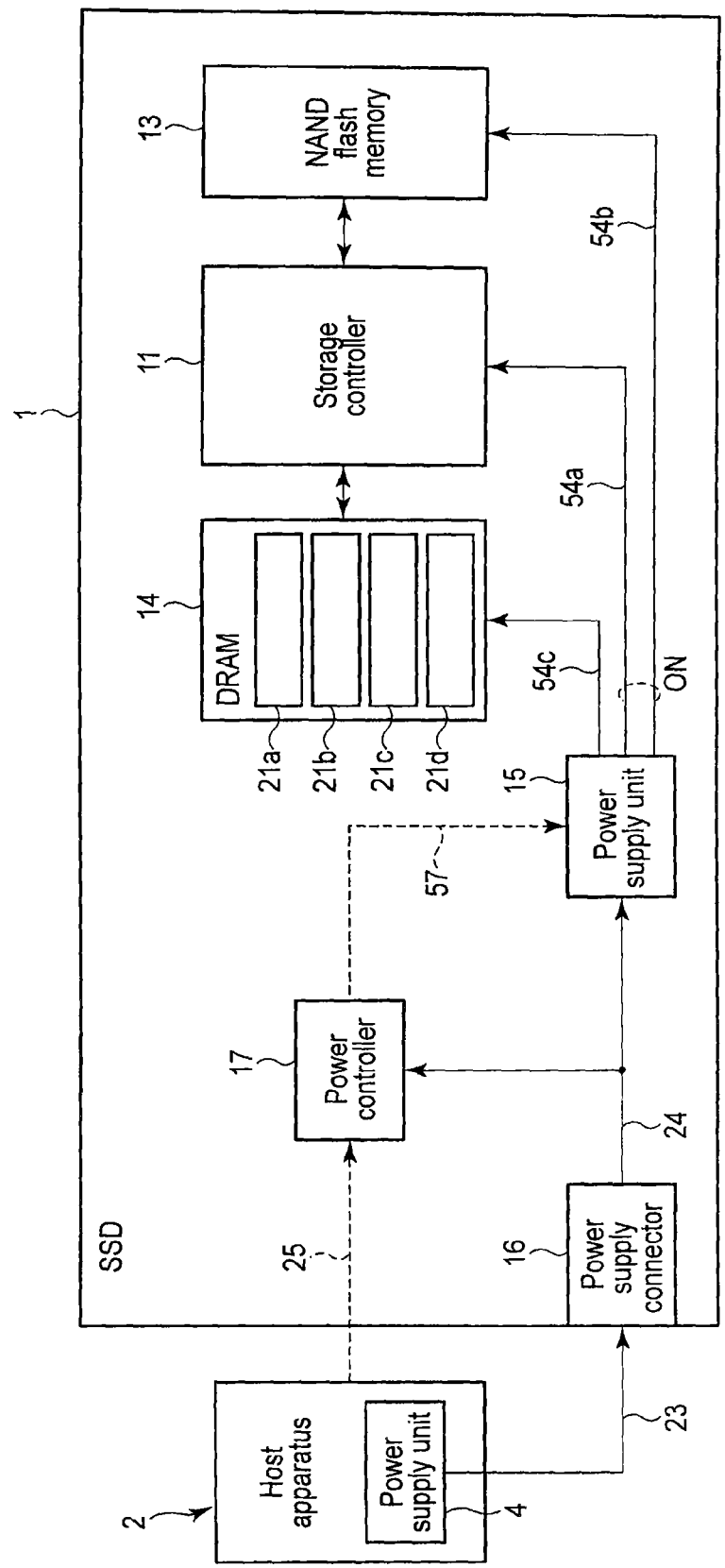
F I G. 4

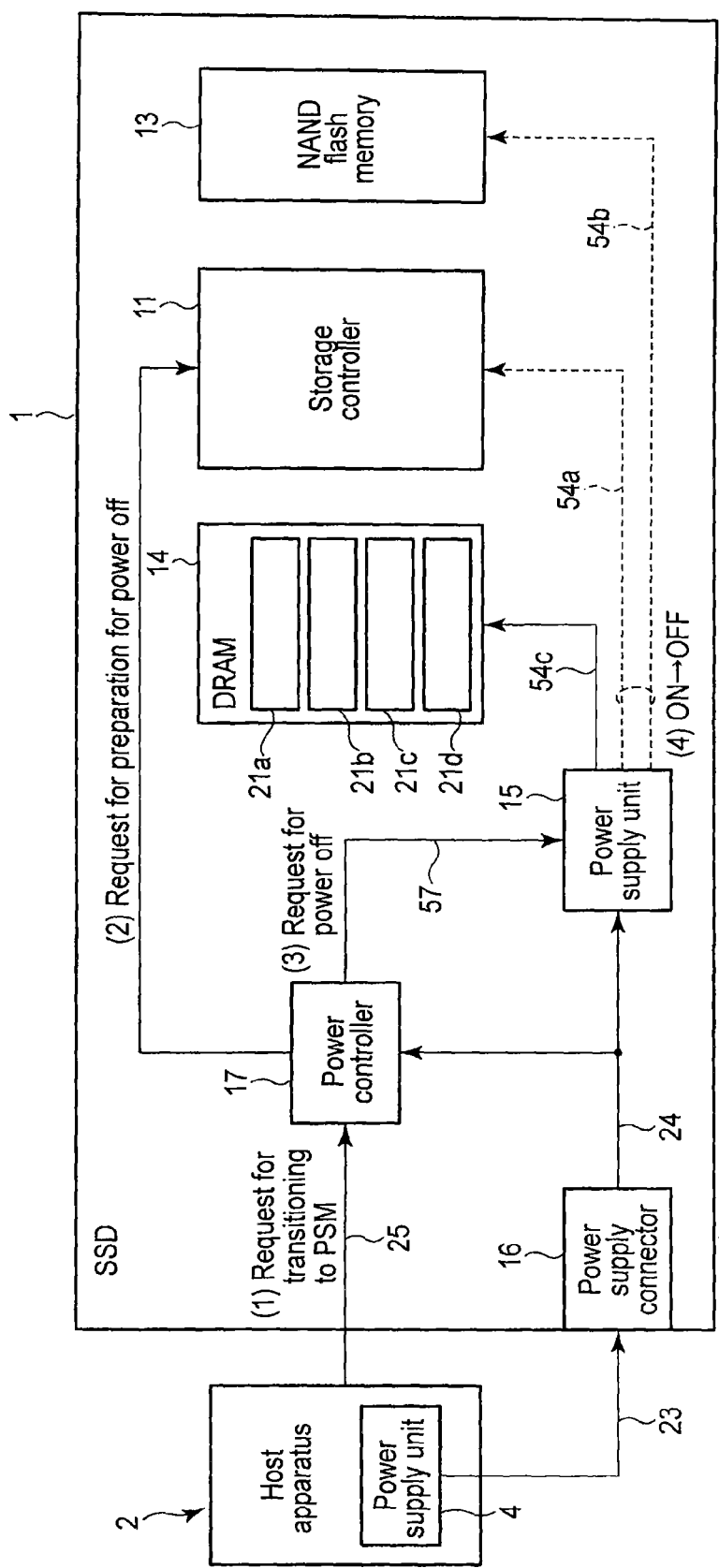
F I G. 5

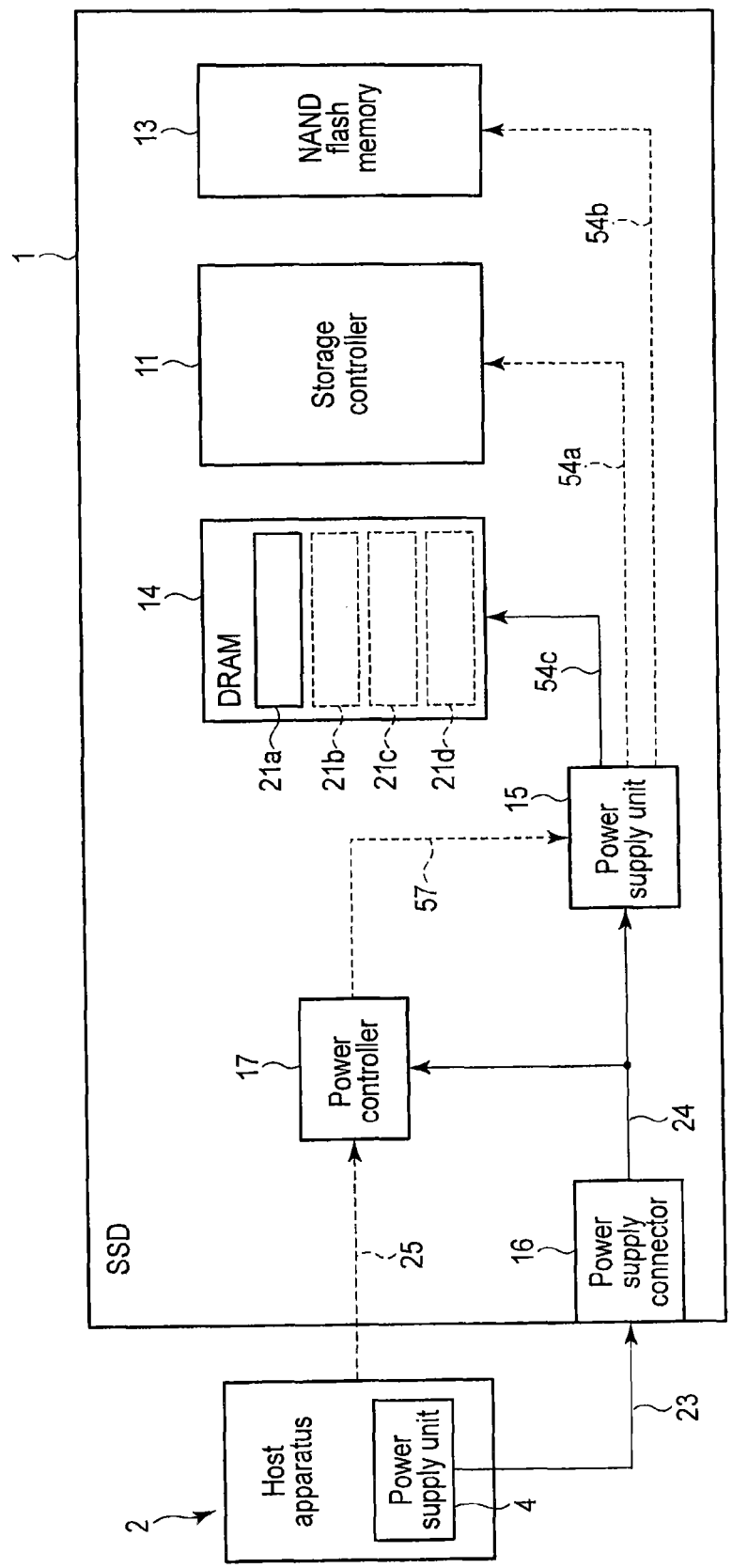
F I G. 6

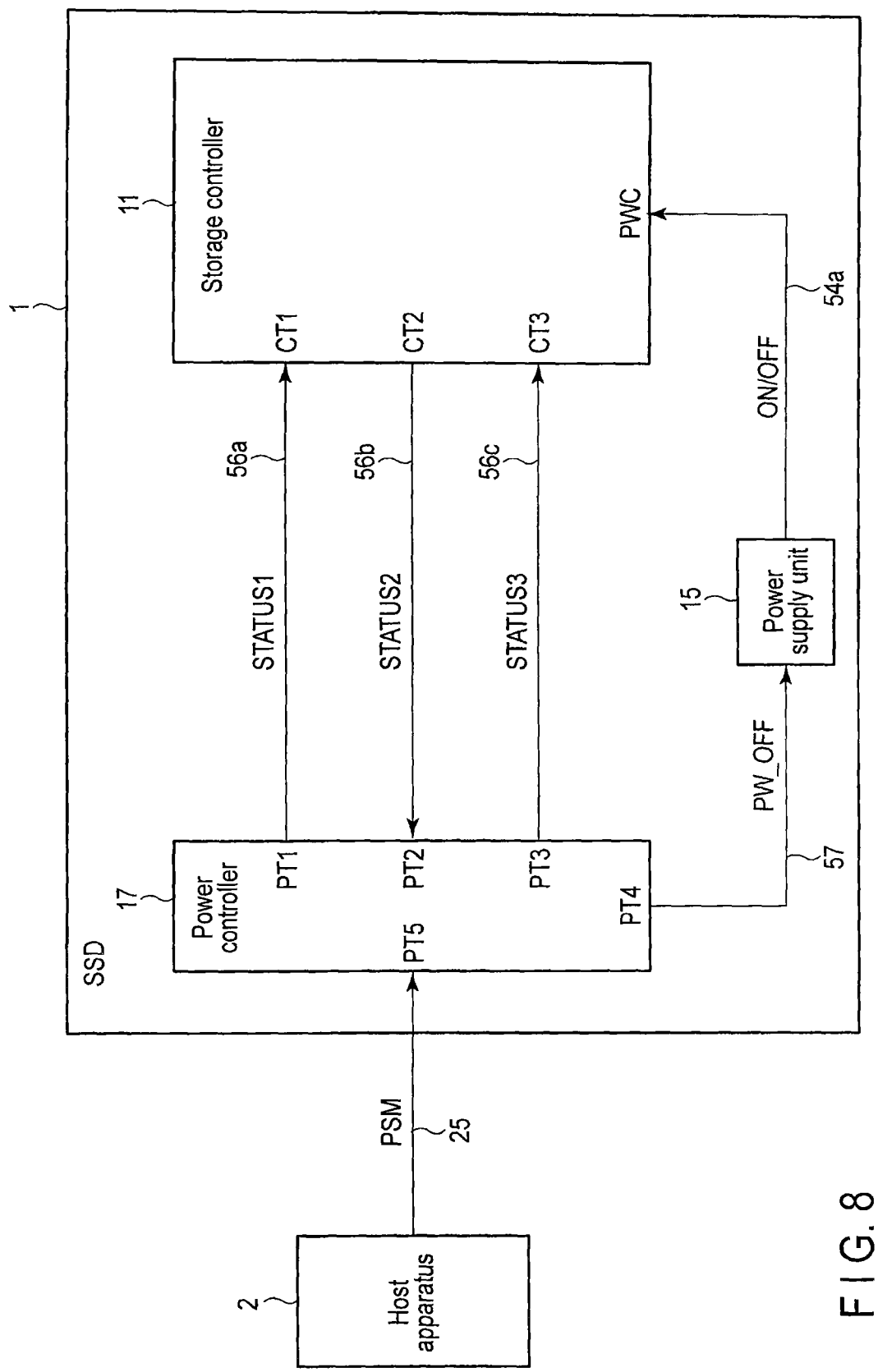
F I G. 8

| Signal name | Signal state |
|---|---|
| PSM | H : Transitioning to power saving mode<br>L : Releasing power saving mode |
| STATUS1 | H : Releasing power saving mode<br>Pulse: Request for transitioning to power saving mode |
| STATUS2 | Pulse: Completion of preparation of power-off/completion of recovering |
| STATUS3 | H : Normal mode<br>L : Power saving mode |
| PW_OFF | H : Power on<br>L : Power off |

FIG. 9

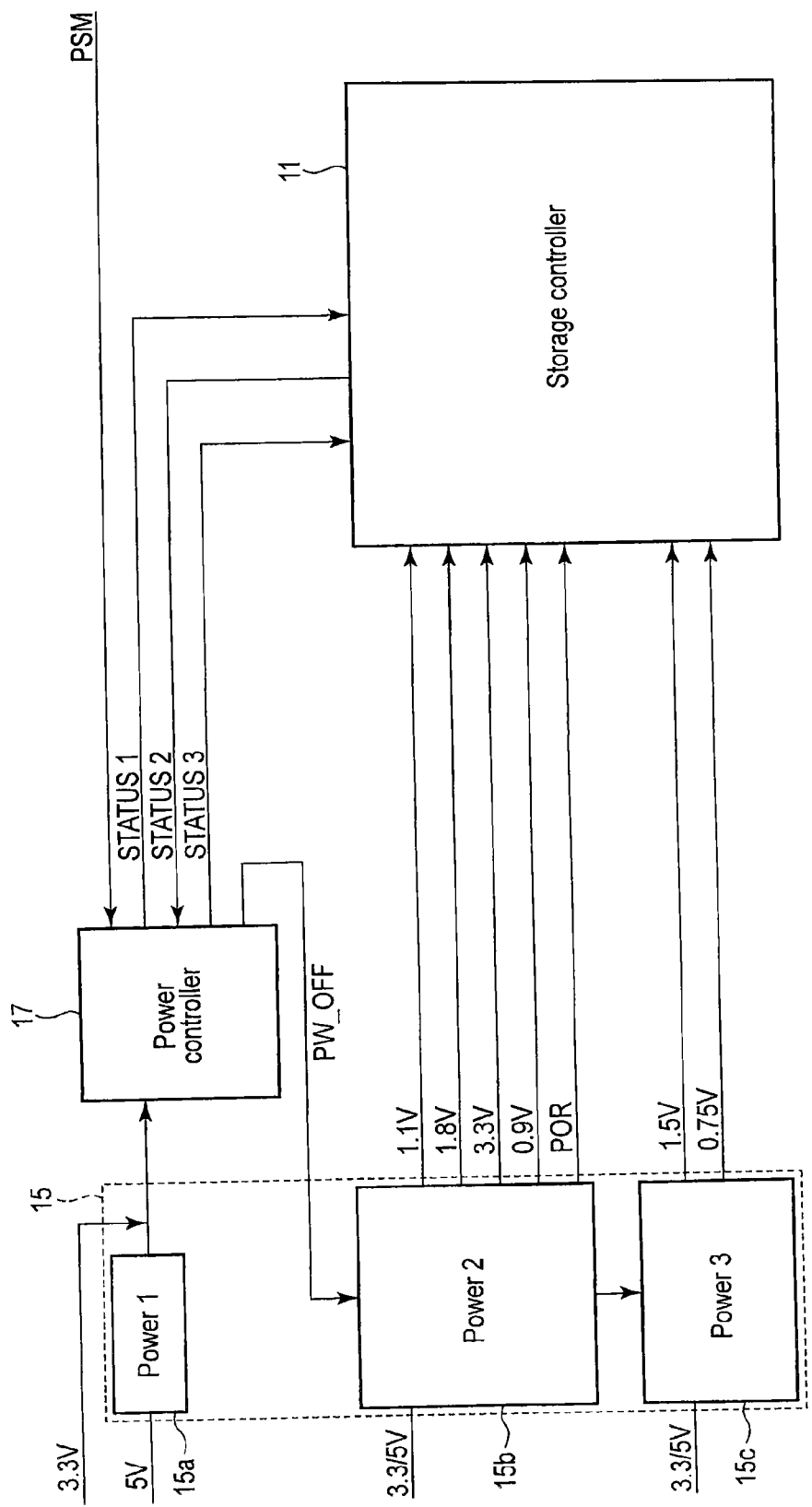
F I G. 14

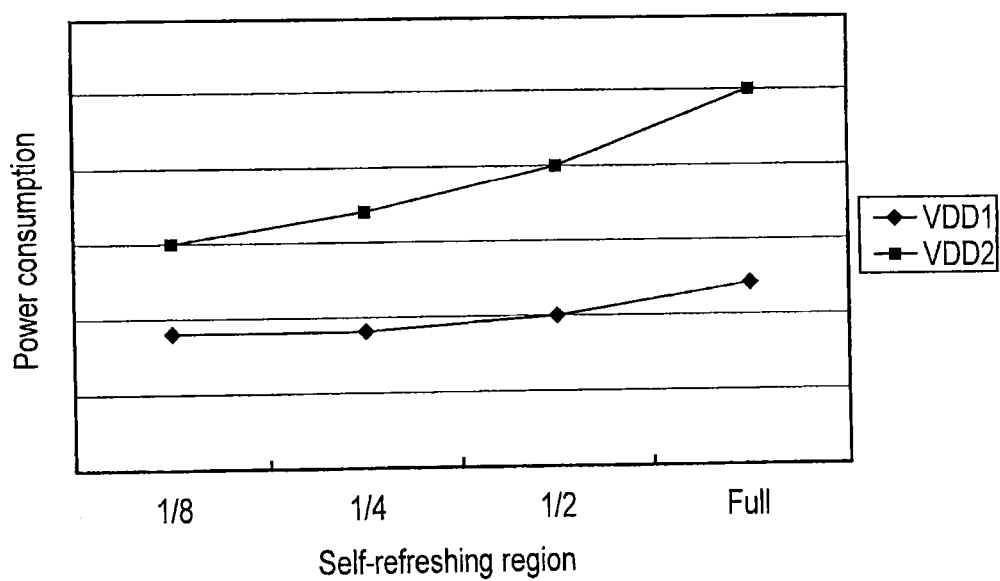
F I G. 15

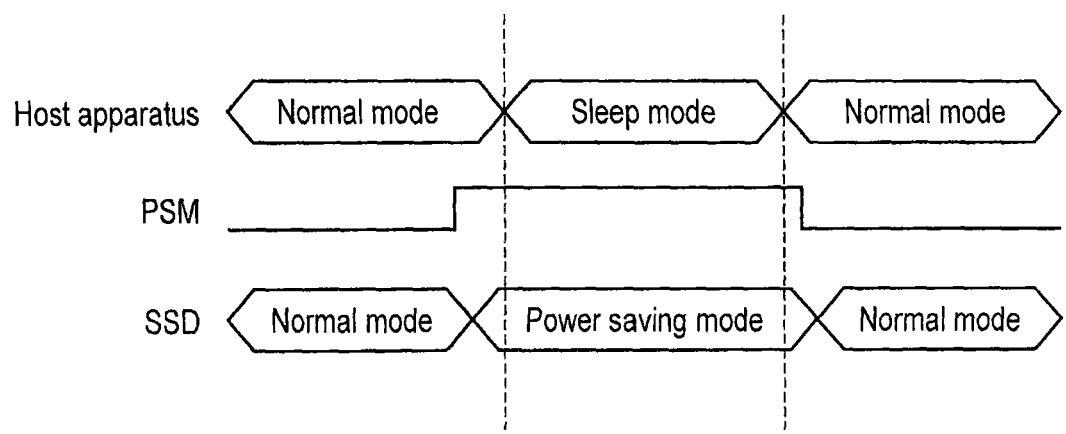
F I G. 20

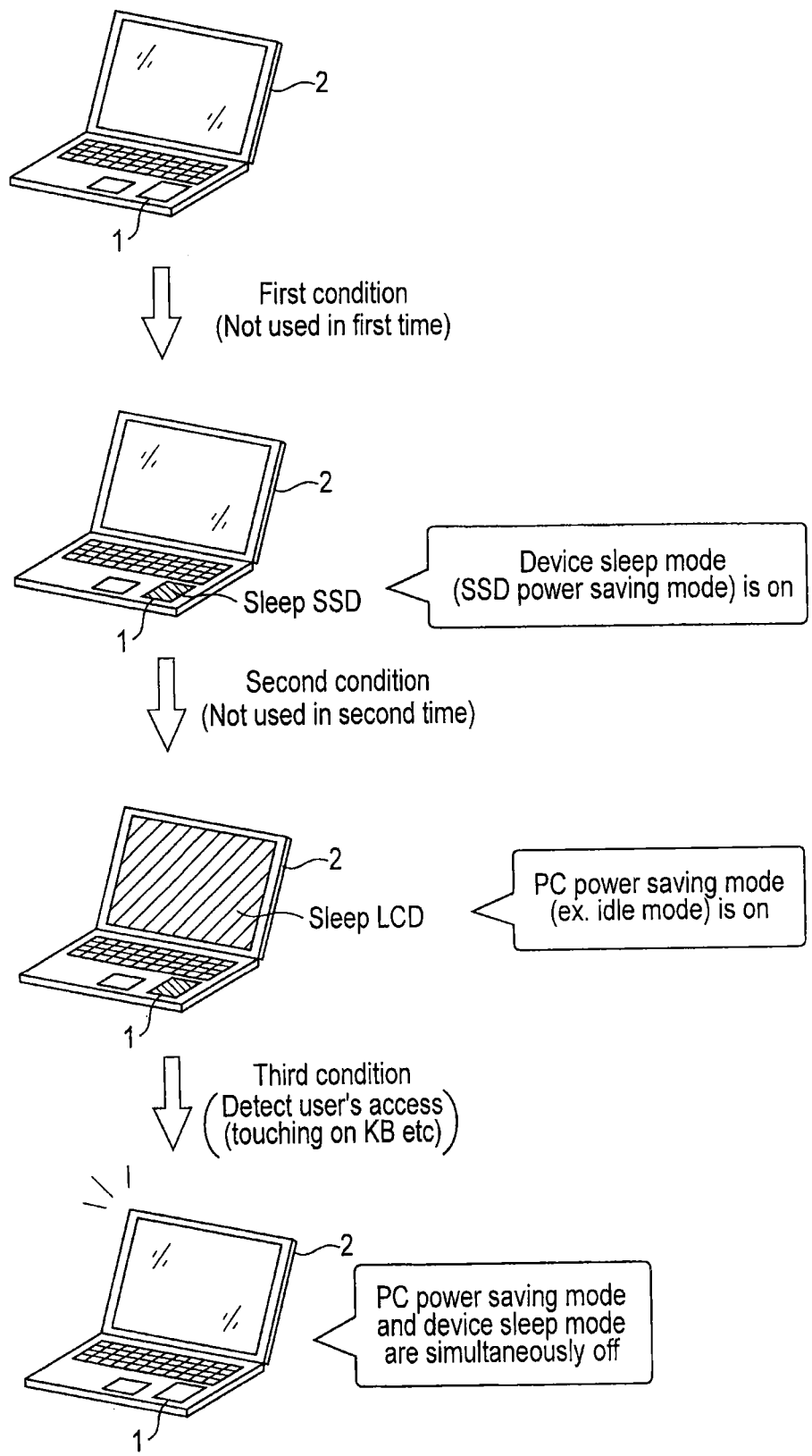
F I G. 22

SEMICONDUCTOR DEVICE WITH POWER MODE TRANSITIONING OPERATION

CROSS-REFERENCE TO RELATED APPLICATIONS

This application claims the benefit of U.S. Provisional Application No. 61/763,616, filed Feb. 12, 2013, the entire contents of which are incorporated herein by reference.

FIELD

Embodiments described herein relate generally to semiconductor devices.

BACKGROUND

A semiconductor device including a NAND flash memory and a DRAM has been provided.

In the semiconductor device, reduction in power consumption is required.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary block diagram illustrating a semiconductor device according to a first embodiment;

FIG. 2 is an exemplary block diagram illustrating an example of a storage controller illustrated in FIG. 1;

FIG. 3 is an exemplary circuit diagram illustrating an example of a switch unit included in a power supply unit illustrated in FIG. 1;

FIG. 4 is an exemplary diagram illustrating an operation state of the semiconductor device illustrated in FIG. 1 in a normal mode period;

FIG. 5 is an exemplary diagram illustrating a transition operation of the semiconductor device illustrated in FIG. 1 for allowing semiconductor device to be transitioned to a power saving mode;

FIG. 6 is an exemplary diagram illustrating an operation state of the semiconductor device illustrated in FIG. 1 in the power saving mode;

FIG. 8 is an exemplary diagram illustrating signals between a power controller and a storage controller illustrated in FIG. 1;

FIG. 9 is an exemplary diagram illustrating details of a plurality of signals illustrated in FIG. 8;

FIG. 14 is an exemplary block diagram illustrating an example of a configuration of a power supply unit according to the first embodiment;

FIG. 15 is an exemplary diagram illustrating an example of power consumption of a volatile memory according to the first embodiment;

FIG. 20 is an exemplary timing chart illustrating a sleep mode operation according to the third embodiment;

FIG. 22 is an exemplary diagram illustrating transition and recovery operations with respect to the power saving mode according to the first to fourth embodiments.

DETAILED DESCRIPTION

Figure 7:
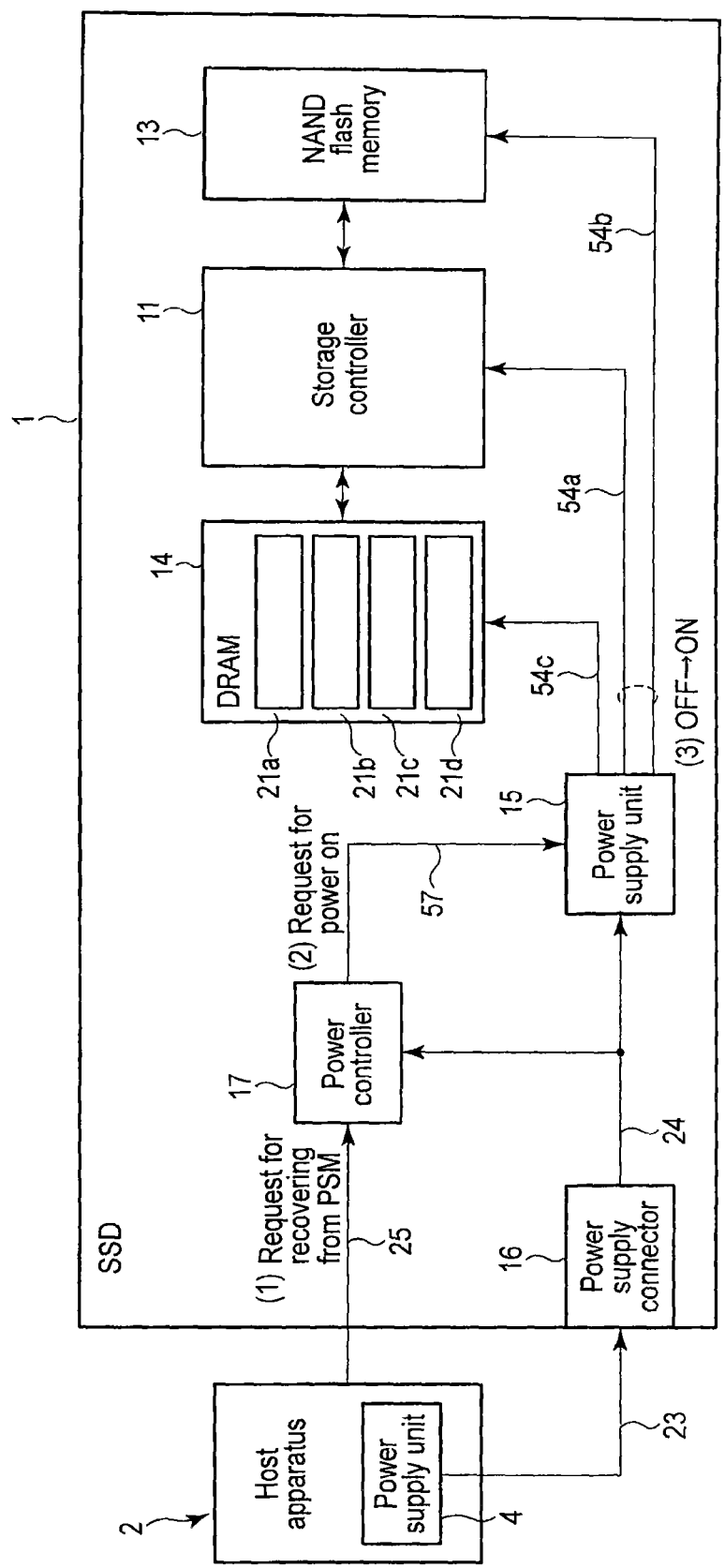
FIG. 7 is an exemplary diagram illustrating a retuning operation of the semiconductor device illustrated in FIG. 1 for allowing the semiconductor device to recover from the power saving mode.

Various embodiments will be described hereinafter with reference to the accompanying drawings.

In general, according to one embodiment, a semiconductor device comprises a nonvolatile memory, a volatile memory, and a controller. The controller is configured to transition a part of the volatile memory to a self-refresh mode when a request for stopping supplying of power to the nonvolatile memory is received.

In this specification, some components are expressed by two or more terms. Those terms are just examples. Those components may be further expressed by another or other terms. And the other components which are not expressed by two or more terms may be expressed by another or other terms.

First Embodiment

1. Configuration of Semiconductor Device

FIG. 1 is a block diagram illustrating a semiconductor device 1 (e.g., a memory system) according to a first embodiment. The semiconductor device 1 is, for example, a semiconductor storage device, of which an example is an SSD (Solid State Drive). The semiconductor device 1 is not limited thereto.

The semiconductor device 1 is configured to be connected, for example, through an interface and a power supply line to a host apparatus 2 (i.e., an electronic apparatus or an information processing apparatus). The host apparatus 2 may appropriately correspond to various types of electronic apparatuses such as a personal computer, a CPU core, or a server connected to a network.

The host apparatus 2 includes a controller 3 and a power supply unit 4 (e.g., power supply circuit). The controller 3 controls various operations of the host apparatus 2. The power supply unit 4 supplies various types of power used in the host apparatus 2 and various types of power used in the semiconductor device 1. In addition, the host apparatus 2 performs data access control on the semiconductor device 1. For example, the host apparatus 2 transmits a write request, a read request, and an erase request to the semiconductor device 1 to perform data writing, reading, and erasing for the semiconductor device 1.

As illustrated in FIG. 1, the semiconductor device 1 includes a storage controller 11, an interface connector (I/F connector) 12, a nonvolatile memory 13, a volatile memory 14, a power supply unit 15, a power supply connector 16, and a power controller 17. The storage controller 11, the nonvolatile memory 13, and the volatile memory 14 are connected to each other via a bus.

The storage controller 11 is an example of a "first controller". The storage controller 11 controls overall operations of the semiconductor device 1. The storage controller 11 controls the nonvolatile memory 13 and the volatile memory 14 (e.g., performs access control). In other words, the storage controller 11 controls data writing, data retaining, data reading, and data erasing of the nonvolatile memory 13 and the volatile memory 14.

The storage controller 11 is configured to be connected through an interface 18 and an interface connector 12 to the host apparatus 2. The interface 18 is, for example, SATA (Serial Advanced Technology Attachment), PCIe (Peripheral Component Interconnect Express), SAS (Serial Attached SCSI), USB (Universal Serial Bus), and the like.

The nonvolatile memory 13 is a non-temporary memory where data does not disappear even though the power supply is disconnected. The nonvolatile memory 13 stores user data which is managed by the host apparatus 2 or stores management information which is managed by the volatile memory 14 as back-up information. The nonvolatile memory 13 is, for example, a NAND flash memory. The nonvolatile memory 13 includes, for example, a plurality of NAND memory chips 19.

Each NAND memory chip 19 includes memory cell arrays where a plurality of memory cells are arranged in a matrix shape. The memory cell array may be configured by arranging a plurality of physical blocks which is a unit of data erasing. In the nonvolatile memory 13, data writing and data reading are performed in units of a physical page. The physical block comprises a plurality of physical pages.

The volatile memory 14 is, for example, a DRAM (Dynamic Random Access Memory). The volatile memory 14 is used as a storage unit for data transfer, a storage unit for management information recording, and a storage unit for a work area. More specifically, the volatile memory 14 as a storage unit for data transfer (e.g., a buffer for data transfer) temporarily stores write data received from the host apparatus 2 before the writing in the nonvolatile memory 13 or temporarily stores read data read from the nonvolatile memory 13 before the transmitting to the host apparatus 2.

The volatile memory 14 as a storage unit for management information reading stores management information of the nonvolatile memory 13 (including information for managing storage positions of data stored in the nonvolatile memory 13 and information for managing states of storage areas of the nonvolatile memory 13).

The volatile memory 14 retains information, for example, by storing electric charges in a condenser. Since the quantity of electric charges is deceased as time elapses, if the volatile memory 14 leaves as it is, the electric charges are discharged in a certain time, so that the volatile memory 14 loses information. In order to prevent this phenomenon, the volatile memory 14 needs a storage retaining operation (i.e., refreshing) for retaining data in the volatile memory 14. In other words, the "refreshing" is an operation of repetitively injecting electric charges every certain time.

The volatile memory 14 according to the embodiment is embedded with a circuit for performing refreshing. Therefore, if a predetermined command and power are applied, the volatile memory 14 itself performs refreshing thereof (i.e., self-refreshing).

That is, the "self-refreshing" is refreshing performed by the volatile memory 14 itself in a state where signals from an external portion of the volatile memory 14 (e.g., signals from the storage controller 11) is stopped. In other words, the "self-refreshing" is refreshing performed by a circuit embedded in the volatile memory 14. In addition, "self-refresh mode" is an operation state where self-refreshing is performed (e.g., self-refreshing is continuously performed for a predetermined period) in a state where signals from an external portion of the volatile memory 14 (e.g., signals from the storage controller 11) is stopped.

Therefore, refreshing of the volatile memory 14 can be performed even in the state where the storage controller 11 is stopped.

The volatile memory 14 includes a plurality of storage areas 21*a*, 21*b*, 21*c*, and 21*d* (i.e., areas, storage regions, retaining units) of which refreshing (e.g., self-refreshing) can be independently set (schematically illustrated in FIG. 4).

The areas 21*a*, 21*b*, 21*c*, and 21*d* are provided so that the volatile memory 14 is classified into, for example, an even number of storage areas. In addition, the number of areas 21*a*, 21*b*, 21*c*, and 21*d* is limited to neither a specific number (e.g., four in FIG. 4) nor an even number. The performing of self-refreshing of the areas 21*a*, 21*b*, 21*c*, and 21*d* may be individually determined.

In addition, in FIGS. 4 to 7, four storage areas 21*a*, 21*b*, 21*c*, and 21*d* are schematically illustrated to be classified. In an actual case, a plurality of memory cells corresponding to each of the storage areas 21*a*, 21*b*, 21*c*, and 21*d* may be located to be distributed over the whole portion of the volatile memory 14.

The power supply unit 15 (e.g., power supply circuit) is configured to be electrically connected through the power supply connector 16 and the power supply lines 23 and 24 to a power supply unit 4 of the host apparatus 2. The power supply unit 15 is supplied with power necessary for the semiconductor device 1 from the host apparatus 2. The power supply unit 15 is electrically connected to the storage controller 11, the nonvolatile memory 13, and the volatile memory 14. The power supply unit 15 supplies power to the storage controller 11, the nonvolatile memory 13, and the volatile memory 14.

The power controller 17 (e.g., a second controller, a power control circuit) is electrically connected to the power supply connector 16 through the power supply line 24. In other words, the power controller 17 is supplied with power from the host apparatus 2 in a path which does not pass through the power supply unit 15 (i.e., a path independent from the power supply unit 15). In other words, the power controller 17 is always supplied with power from the host apparatus 2. Therefore, the power controller 17 can be operated even in the state where the storage controller 11 is stopped.

The power controller 17 is configured to be electrically connected through a signal line 25 to the host apparatus 2. The power controller 17 controls operations of the power supply unit 15 and the storage controller 11 based on signals transmitted from the host apparatus 2. The power controller 17 controls, for example, power supplying/power disconnection with respect to the storage controller 11 and the nonvolatile memory 13.

FIG. 2 is a block diagram illustrating an example of the storage controller 11 illustrated in FIG. 1. The storage controller 11 includes a data access bus 31, a first circuit control bus 32, and a second circuit control bus 33. The first circuit control bus 32 is connected to a processor 34 which controls the overall operations of the storage controller 11. The first circuit control bus 32 is connected to a boot ROM 35 through a ROM controller 36. A boot program which boots management programs (FW: firmware) stored in the nonvolatile memory 13 is stored in the boot ROM 35.

In addition, the first circuit control bus 32 is connected to a clock controller 37. The clock controller 37 receives a power-on reset signal from the power supply unit 15 illustrated in FIG. 1 and supplies a reset signal and a clock signal to each component.

The second circuit control bus 33 is connected to the first circuit control bus 32. An I²C circuit 38 for receiving data from a temperature sensor, a parallel IO (PIO) circuit 39 for supplying a status display signal to a status display LED, and a serial IO (SIO) circuit 40 of controlling an RS232C interface are connected to the second circuit control bus 33.

An ATA interface controller (ATA controller) 41, a first ECC (Error Checking and Correction) circuit 42, a NAND controller 43 as a controller for the nonvolatile memory 13, and a DRAM controller 44 as a controller for the volatile memory 14 are connected to both of the data access bus 31 and the first circuit control bus 32.

The ATA controller 41 communicates data with the host apparatus 2 through an ATA interface. An SRAM 45 used as a data work area and a firmware develop area is connected through an SRAM controller 46 to the data access bus 31. A firmware stored in the nonvolatile memory 13 is transmitted to the SRAM 45 by a boot program stored in the boot ROM 35 at the starting time.

The NAND controller 43 includes a NAND I/F 47, a second ECC circuit 48, and a DMA controller 49 for DMA transfer control. The NAND I/F 47 performs an interface process with respect to the nonvolatile memory 13. The DMA controller 49 for DMA transfer control performs access control between the nonvolatile memory 13 and the volatile memory 14. The second ECC circuit 48 performs encoding of the second error correction code and encoding and decoding of the first error correction code.

The first ECC circuit 42 performs decoding of the second error correction code. The first error correction code and the second error correction code are, for example, a hamming code, a BCH (Bose Chaudhuri Hocqenghem) code, an RS (Reed Solomon) code, an LDPC (Low Density Parity Check) code, or the like. Correction performance for the second error correction code is higher than, for example, the correction performance for the first error correction code.

FIG. 3 is a circuit diagram illustrating an example of a switch unit included in the power supply unit 15 illustrated in FIG. 1. The power supply unit 15 includes a plurality of switch elements (including switch elements 51a, 51b, 51c, 52a, 52b, and 52c). The power supply unit 15 distributes various types of power to the storage controller 11, the nonvolatile memory 13, the volatile memory 14, and the like by controlling turning-on and turning-off of the switch elements.

The power supply unit 15 receives a plurality of power (including power V1 and V2), for example, from the host apparatus 2. The power supply unit 15 is supplied through a power supply line 24a with the power V1 and is supplied through a power supply line 24b with the power V2. The power supply line 24a is connected to the one end of each of the switch elements 51a, 51b, and 51c. The power supply line 24b is connected to the one end of each of the switch elements 52a, 52b, and 52c. The other end of each of the switch elements 51a and 52a is connected through a power supply line 54a to the storage controller 11. The other end of each of the switch elements 51b and 52b is connected through a power supply line 54b to the nonvolatile memory 13. The other end of each of the switch elements 51c and 52c is connected through a power supply line 54c, for example, to the volatile memory 14.

2. Operations of Semiconductor Device 1

Operations of the semiconductor device 1 having the above configuration will be described. The semiconductor device 1 has a normal mode (first mode, active mode) where normal operations are performed and a power saving mode (second mode) of which power consumption is smaller than that of the normal mode. The normal mode is a state where the data transfer operation between the host apparatus 2 and the semiconductor device 1 can be performed. In the normal mode, the semiconductor device 1 performs a data writing operation, a data reading operation, and a data erasing operation in response to a request from the host apparatus 2. The term "mode" denotes a state (e.g., operation state). The state "power consumption is small" includes a state where a power-supplied area is smaller than that of the normal mode or a state where the operation is performed at a lower clock frequency than that of the normal mode.

On the other hand, the power saving mode is a state where the data transfer operation between the host apparatus 2 and the semiconductor device 1 is stopped. At this time, the semiconductor device 1 is in a stop state. Particularly, in the embodiment, in the power saving mode, the power which is to be supplied to the storage controller 11 and the nonvolatile memory 13 is limited, so that a super power saving state (first power saving state, or device sleep mode) equivalent to a power-off state is implemented. In addition, the state "power which is to be supplied is limited" is a state where the power is disconnected or a state the power for allowing the functional parts such as the storage controller 11 and the nonvolatile memory 13 to normally function is not sufficiently supplied.

For example, in the host apparatus 2 (e.g., a personal computer), an idle mode, a standby mode, a stop mode (stop state), a sleep mode, and the like are included as the power saving mode for reducing power consumption.

The idle mode is a mode where the host apparatus is in a second power saving state for partially reducing power to be supplied to a module or a unit included in the host apparatus such as a display, which is not used while the host apparatus works. The standby mode is a mode where data in operation is retained in the memory in the host apparatus and the host apparatus itself is in a third power saving state (i.e., a state where power consumption is reduced excluding the power for retaining data of the memory). The stop mode is a mode where the data in operation is retained in an external storage device seen from the host apparatus such as an SSD or a hard disk drive and the host apparatus itself is in a fourth power saving state (i.e., a state where power consumption is reduced from the third power saving state including the power for retaining data of the memory in the host apparatus. The sleep mode is a combination mode of the standby mode and the stop mode. For example, the sleep mode is a mode where data in operation is retained in both of the memory and the external storage device and the host apparatus is in the third power saving state. The idle mode, standby mode, the sleep mode, and the stop mode are classified according to power consumption, a time taken for entering each mode, and a time taken for recovering from each mode. The power consumption is decreased in the order of the idle mode, the standby mode, the sleep mode, the stop mode, and the state where the driving power of the host apparatus is completely shut down. The power consumption can be reduced by a method of decreasing the number of circuits to which power voltage is to be applied, a method of delaying an operation clock, and other methods. The transition time and the recovery time with respect to each mode are delayed in the order of the idle mode, the standby mode, the sleep mode, the stop mode, and the state where the driving power of the host apparatus is completely shut down.

In this manner, in the embodiment, for example, in addition to the power saving mode configured in the host apparatus itself, variations of the power saving methods matching with user's use environment can be provided, and user's convenience can be improved. For example, in addition to the power saving states which can be set by the host apparatus, the above-described first power saving state can be made. More specifically, in the case where a user watches a DVD or a TV broadcast program through the host apparatus or the case where another external storage device additionally connected is functioned, any one of the idle mode, the standby mode, the sleep mode, and the stop mode cannot be functioned in the state where the semiconductor device 1 is not used and the host apparatus 2 is used. However, total power consumption including the semiconductor device 1 and the host apparatus 2 can be reduced by suppressing the power consumption of the semiconductor device 1 as a single device.

In addition, for example, by setting the power saving mode of the semiconductor device 1 to be started earlier than the power saving mode of the host apparatus 2, it is possible to obtain power saving effect which further matches with the user's use environment. More specifically, in the case where a state where the semiconductor device 1 is not used in a first predetermined time after the starting of the host apparatus 2 is detected by a detection unit (not shown) in the host apparatus 2, the semiconductor device 1 may be set by the host apparatus 2 so as to be automatically transitioned to one of the idle mode, the standby mode, the sleep mode, and the stop mode. However, for example, in the semiconductor device 1 according to the embodiment, the semiconductor device 1 is set so as to start preparing for transitioning of the semiconductor device 1 to the power saving mode earlier than each mode set by the host apparatus 2 (after a second predetermined time which is shorter than the first predetermined time elapses) according to the setting, so that it is possible to fast transition the semiconductor device 1 to the power saving mode.

In addition, the timing of recovering from the power saving mode of the semiconductor device 1 may be configured to match with the timing of recovering for the host apparatus 2 from the power saving mode. For example, a configuration may be made where the request for recovering from the second mode (PSM) is transmitted from the host apparatus 2 to the power controller 17 of the semiconductor device 1 according to the recovery of the host apparatus 2 from the power saving mode, or a configuration may be made where a detection unit for detecting the recovery of the host apparatus 2 from the power saving mode is prepared to the semiconductor device 1 and the power controller 17 transmits a second power control request to the power supply unit 15 according to the recovery of the host apparatus 2 from the power saving mode. According to these configurations, the timing of recovering for the semiconductor device 1 from the power saving mode and the timing of recovering for the host apparatus 2 from the power saving mode can be cooperatively used, so that it is possible to improve user's convenience.

FIG. 22 is a diagram exemplifying the host apparatus 2 (e.g., a personal computer) and the semiconductor device 1 (e.g., an SSD) connected to the host apparatus 2 and illustrating transition and recovery operations with respect to the power saving mode according to the embodiment.

As illustrated in FIG. 22, for example, in the case where the first condition is satisfied, the semiconductor device 1 limits the power which is to be supplied to the storage controller 11 and the nonvolatile memory 13, so that the super power saving state (the second mode, the first power saving state, or the device sleep mode) equivalent to the power-off state is implemented. In other words, the semiconductor device 1 is in the power saving state. The "first condition" corresponds to, for example, a case where the semiconductor device 1 is not used in the first time period.

Next, in the case where the host apparatus 2 satisfies, for example, the second condition, the host apparatus 2 is in the power saving state. The power saving state of the host apparatus 2 is, for example, the idle mode, the standby mode, the sleep mode, or the stop mode. The "second condition" corresponds to, for example, a case where the semiconductor device 1 is not used in the second time period.

Next, when the host apparatus 2 receives, for example, user access, the host apparatus 2 and the semiconductor device 1 recover to the normal mode.

Hereinafter, the power saving mode of the semiconductor device 1 (the second mode, the first power saving state, or the device sleep mode) will be described in detail.

FIG. 4 is a diagram illustrating an operation state of the semiconductor device 1 in the normal mode period. In addition, FIG. 4 illustrates extracted circuits necessary for explaining the power saving mode according to the embodiment.

The power controller 17 and the power supply unit 15 are configured to be supplied with power through the power supply connector 16 from the host apparatus 2. In the normal mode, the power supply unit 15 supplies power through the power supply lines 54a, 54b, and 54c to the storage controller 11, the nonvolatile memory 13, and the volatile memory 14.

Therefore, the storage controller 11, the nonvolatile memory 13, and the volatile memory 14 can perform normal operations. The semiconductor device 1 performs operations according to a request (including a write request, a read request, or an erase request) of the host apparatus 2. Actually, each of the power supply lines 54a, 54b, and 54c includes a plurality of power supply lines corresponding to various types of power. However, in order to avoid complicated drawings, each of the power supply lines 54a, 54b, and 54c is illustrated as one power supply line.

FIG. 5 is a diagram illustrating a transition operation for transitioning to the power saving mode. First, the host apparatus 2 transmits a request, for example, to the power controller 17 of the semiconductor device 1 for transitioning to the power saving mode (PSM) through the signal line 25. Alternatively, in a modified example, the host apparatus 2 may directly transmit the request to the storage controller 11 for transitioning to the power saving mode (PSM).

The power controller 17 transmits a request (e.g., first signal) to the storage controller 11 for preparation for power-off (e.g., power disconnection or supplied power reduction) in response to the request for transitioning to the PSM from the host apparatus 2. The storage controller 11 receives the first signal and performs a preparation process for power-off. More specifically, the storage controller 11 performs a preparation process for the storage controller 11 and a preparation process (e.g., a saving process) for the volatile memory 14.

<Preparation Process for Storage Controller 11>

The storage controller 11 writes, for example, configuration information on the semiconductor device 1 just before the transitioning to the power saving mode in the nonvolatile memory 13. The configuration information includes, for example, information which the host apparatus 2 sets through the interface 18 in the semiconductor device 1.

In the preparation process, the storage controller 11 may write a part or a whole portion of management information, which is loaded on a volatile area from the nonvolatile memory 13, in the nonvolatile memory 13. The management information may include a management table for managing a correspondence relationship between logical addresses and physical addresses of data stored in the nonvolatile memory 13 and information for managing states of storage areas of the nonvolatile memory 13 (including the number of erasing operations for a block, the number of rewriting operations for a block, information on whether to be an empty block, and information on a defective block).

<Preparation Process for Volatile Memory 14>

At a time of transitioning to the power saving mode, storage controller 11 allows the volatile memory 14 to be transitioned to the self-refresh mode and stops access to the volatile memory 14. Herein, the volatile memory 14 according to the embodiment, in the power saving mode period, only a part of the volatile memory 14 is transitioned to the self-refresh mode, and refreshing of the remaining part thereof is not performed (refreshing is stopped).

In other words, the volatile memory 14 according to the embodiment includes the "first area" where is transitioned to the self-refresh mode to retain data and the "second area" where the refreshing is not performed (refreshing is stopped) not to retain data in the power saving mode period.

As described above, the volatile memory 14 includes a plurality of the storage areas 21a, 21b, 21c, and 21d of which refreshing (e.g., self-refreshing) can be independently set. In addition, for the convenience of description, although the case where the volatile memory 14 includes the four storage areas 21a, 21b, 21c, and 21d is schematically described herein, the number of storage areas is not limited to four. The number of storage areas may be smaller than four or larger than four.

Each of the storage areas 21a, 21b, 21c, and 21d is arbitrarily set so as to be included in one of the "first area" and "second area". The setting may be performed in advance at the initial setting time or in the normal mode period, or the setting may be performed based on type or content of information included in the volatile memory 14 at the time of transitioning to the power saving mode.

In the embodiment, the case where one storage area 21a is set to the "first area" and the remaining three storage areas 21b, 21c, and 21d are set to the "second areas" will be described. Therefore, in the description hereinafter, for the convenience, the storage area 21a is called the "first area 21a", and the storage areas 21b, 21c, and 21d are called the "second areas 21b, 21c, and 21d".

In addition, for example, in the case where further reduction in power consumption is desired, for example, one of classified eight storage areas may be set to the "first area", and the remaining areas may be set to the "second areas". On the other hand, for example, in the case where reduction in the recovery time taken for recovering from the power saving mode is desired, for example, two or three areas 21a, 21b, and 21c may be set to the "first areas", and the remaining one area 21d may be set to the "second area". In addition, the method of classification of the "first areas" and the "second areas" is not limited to the above-described examples.

In the embodiment, before the refreshing of the second areas 21b, 21c, and 21d is stopped, the storage controller 11 transfers at least a part of the data stored in the second areas 21b, 21c, and 21d to the first area 21a. The data stored in the volatile memory 14 may comprise the "first data", the "second data", and the "third data".

The "first data" includes, for example, the management information of the nonvolatile memory 13 and at least a part of a start program of the semiconductor device 1 (e.g., a start program or data used at a starting time of the storage controller 11). The "management information of the nonvolatile memory 13" includes, for example, a management table for managing a correspondence relationship between logical addresses and physical addresses of data stored in the nonvolatile memory 13 or information for managing states of storage areas of the nonvolatile memory 13 (including the number of erasing operations for a block, the number of rewriting operations for a block, information on whether to be an empty block, and information on a defective block).

The "at least a part of a start program of the semiconductor device 1" is, for example, program data which is used for starting (e.g., fast starting) of the semiconductor device 1 at a time of recovering from the power saving mode. For example, at a time of recovering from the power saving mode, data retained in advance in the volatile memory 14 rather than data read from the nonvolatile memory 13 is program data by which the starting of the semiconductor device 1 is allowed to be fast.

The "second data" is data of which a degree of importance is lower than that of the first data. For example, the second data is data of which erasing does not cause a practical problem. The "second data" is, for example, information which can be read again from the nonvolatile memory 13.

An example of the "second data" is data which is read from the nonvolatile memory 13 to remain in a read cache. In addition, another example of the "second data" is data which is read from the nonvolatile memory 13 to be retained in the volatile memory 14 until a minimum write unit of the nonvolatile memory 13 is made. In addition, in the case where there is no problem at the start time of the semiconductor device 1, the "second data" may include at least a portion of the start program of the semiconductor device 1.

The "third data" is, for example, data which is received from the host apparatus 2 and is not yet written in the nonvolatile memory 13. In other words, an example of the "third data" is data which is retained in a write cache and is not yet written in the nonvolatile memory 13.

The storage controller 11 according to the embodiment classifies (i.e., makes a correspondence of), for example, data retained in the second areas 21b, 21c, and 21d into the "first data", the "second data", and the "third data" at the time of transitioning to the power saving mode. In addition, the storage controller 11 may manage the data retained in the second areas 21b, 21c, and 21d to classify the data into the "first data", the "second data", and the "third data" in advance in the normal mode period.

Before the storage controller 11 stops the refreshing of the second areas 21b, 21c, and 21d, the storage controller 11 transfers at least a part of the first data in the second areas 21b, 21c, and 21d to the first area 21a. In addition, the storage controller 11 transfers at least a part of the third data in the second areas 21b, 21c, and 21d to the nonvolatile memory 13. In addition, the storage controller 11 may transfer at least a part of the first data in the second areas 21b, 21c, and 21d to the nonvolatile memory 13.

At this time, the storage controller 11 may secure an empty space which is to receive the first data from the second areas 21b, 21c, and 21d in the first area 21a by transferring at least a part of the third data in the first area 21a to the nonvolatile memory 13.

In this manner, the storage controller 11 saves and transfers the data retained in the power saving mode to a portion of the areas of the volatile memory 14. In other words, the storage controller 11 according to the embodiment arranges the data to be retained in a unit fraction with an even-number denominator of a capacity of the volatile memory 14 and collects the arranged data in the area of which the refreshing is performed.

In one modified example, instead of the above-described configuration, the storage controller 11 may not write the first data (e.g., the management information of the nonvolatile memory 13) in the second areas 21b, 21c, and 21d of the volatile memory 14 but write the first data only in the first area 21a in the normal mode period. According to this configuration, it is possible to shorten the time taken for saving the data in the second areas 21b, 21c, and 21d to the first area 21a or the nonvolatile memory 13.

If a series of the preparation processes (e.g., the saving process) described above is completed, the storage controller 11 transmits a request to the volatile memory 14 for transitioning to the self-refresh mode. In the embodiment, the storage controller 11 transitions the first area 21a to the self-refresh mode and transmits a request to the volatile memory 14 for not performing the refreshing (e.g., self-refreshing) of the second areas 21b, 21c, and 21d. For example, in the state where the second data remain in the second areas 21b, 21c, and 21d, the storage controller 11 transmits the request for not performing the refreshing of the second areas 21b, 21c, and 21d.

In addition, after the storage controller 11 issues the transition request to the volatile memory 14, the storage controller 11 transmits a signal (e.g., second signal) of completion of preparation of transitioning to the power saving mode to the power controller 17. The power controller 17 receives the second signal and transmits a request (i.e., power-off request) for disconnecting the power supplied to the storage controller 11 and the nonvolatile memory 13 to the power supply unit 15. In response to the power-off request, the power supply unit 15 disconnects the power supplied to the storage controller 11 and the nonvolatile memory 13.

As a result, the semiconductor device 1 enters to the power saving mode. In other words, the storage controller 11 and the nonvolatile memory 13 are powered off. Therefore, a super power saving state of the semiconductor device 1 is implemented.

FIG. 6 is a diagram illustrating the semiconductor device 1 which is in the power saving mode. As illustrated in FIG. 6, in the power saving mode, the volatile memory 14 performs the self-refreshing of the first area 21a. Therefore, the data of the first area 21a is retained. On the other hand, the volatile memory 14 does not perform the self-refreshing of the second areas 21b, 21c, and 21d. Therefore, the data (second data) remaining in the second areas 21b, 21c, and 21d are lost.

FIG. 7 is a diagram illustrating the recovery operation for recovering from the power saving mode. First, the host apparatus 2 transmits a recovery request to the power controller 17 of the semiconductor device 1 for recovering from the power saving mode (PSM) through the signal line 25. In response to the request for recovering from the PSM, the power controller 17 transmits a request (i.e., power-on request) to the power supply unit 15 for supplying the power to the storage controller 11 and the nonvolatile memory 13. In response to the power-on request, the power supply unit 15 starts supplying power to the storage controller 11 and the nonvolatile memory 13.

As a result, the semiconductor device 1 is extracted from the power saving mode (namely, is transitioned from the power saving mode to the normal mode), and the storage controller 11 and the nonvolatile memory 13 perform, for example, the same starting processes as those of the power-on time of the semiconductor device 1 and, after that, recover to the state where the data transfer operation is available. Herein, for example, the storage controller 11 may be fast started by using at least a part of the start program retained in the first area 21a of the volatile memory 14.

In addition, since the power controller 17 is directly supplied with the power from the power supply connector 16, the power controller 17 can operate in response to a request of the host apparatus 2 even in the power saving mode period. Similarly, since the power supply unit 15 is directly supplied with the power from the power supply connector 16, the power supply unit 15 can operate in response to a request of the power controller 17 even in the power saving mode period.

3. Embodiments of Power Controller 17

Next, a more specific example of the power controller 17 which is in the power saving mode will be described. FIG. 8 is a diagram illustrating signals between the power controller 17 and the storage controller 11. FIG. 9 is a diagram illustrating details of the signals illustrated in FIG. 8.

The power controller 17 and the storage controller 11 are electrically connected to each other by a signal line 56a for signal STATUS1, a signal line 56b for a signal STATUS2, and a signal line 56c for a signal STATUS3. The signal line 56a electrically connects a port PT1 of the power controller 17 and a port CT1 of the storage controller 11. The signal line 56b electrically connects a port PT2 of the power controller 17 and a port CT2 of the storage controller 11. The signal line 56c electrically connects a port PT3 of the power controller 17 and a port CT3 of the storage controller 11.

The power controller 17 and the power supply unit 15 are electrically connected to each other by a signal line 57 for the signal PW_OFF. The one end of the signal line 57 is connected to a port PT4 of the power controller 17. The power controller 17 and the host apparatus 2 are electrically connected to each other by a signal line 25 for a signal PSM. The one end of the signal line 25 is connected to a port PT5 of the power controller 17.

Figure 10:
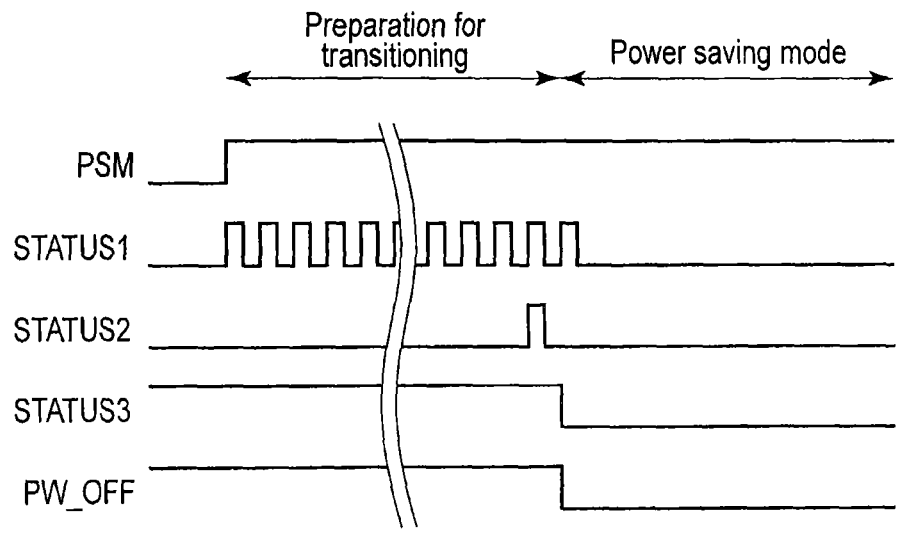
FIG. 10 is an exemplary timing chart illustrating a transition operation of the power controller illustrated in FIG. 1 for allowing the power controller to be transitioned to the power saving mode.
Figure 11:
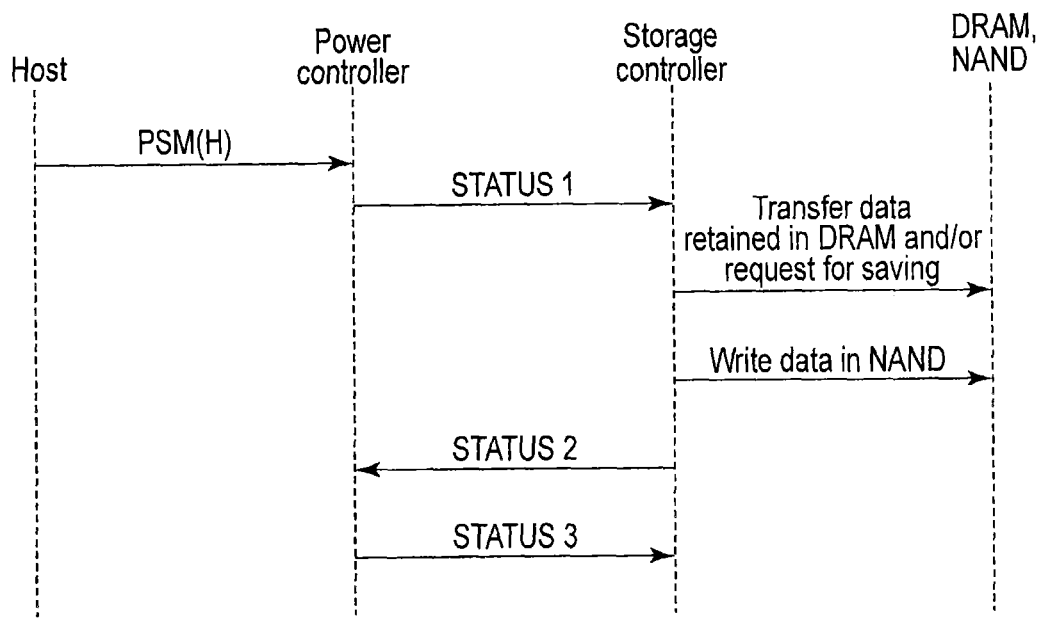
FIG. 11 is an exemplary diagram illustrating a preparation operation of the storage controller illustrated in FIG. 1.

FIG. 10 is a timing chart illustrating the transition operation for allowing the power controller 17 to be transitioned to the power saving mode. First, in order to be transitioned to the power saving mode, the host apparatus 2 sets the signal PSM to a high level.

In response to the signal PSM having a high level, the power controller 17 outputs a continuous pulse as the signal STATUS1. In response to the signal STATUS1 formed with a continuous pulse, the storage controller 11 performs the above-described preparation process for power-off (power disconnection).

When the preparation for power-off is completed, the storage controller 11 outputs a pulse as the signal STATUS2. In response to the signal STATUS2 formed with a pulse, the power controller 17 sets both of the signal STATUS3 and the signal PW_OFF to a low level. In response to the signal PW_OFF having a low level, the power supply unit 15 disconnects the power supplied to the storage controller 11 and the nonvolatile memory 13. As a result, a super power saving state of the semiconductor device 1 is implemented.

Figure 12:
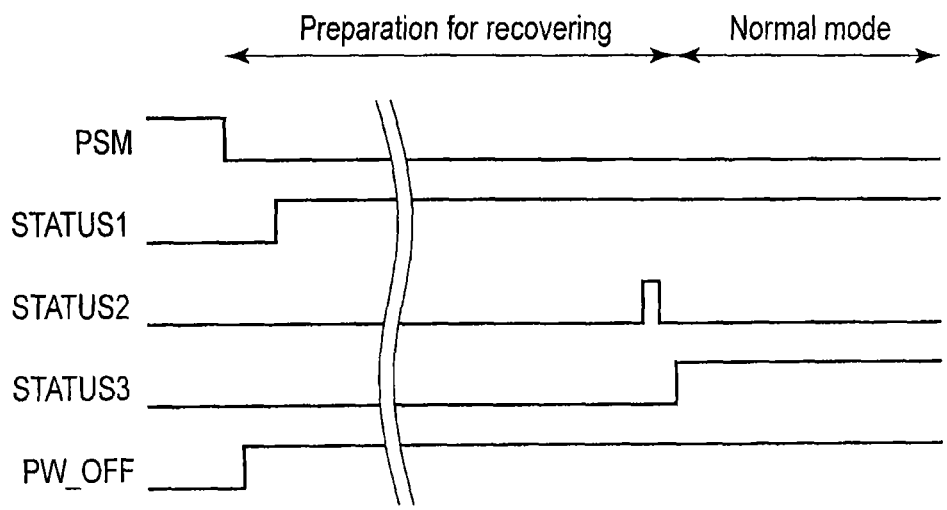
FIG. 12 is an exemplary diagram illustrating a recovery operation of the power controller illustrated in FIG. 1 for allowing the power controller to recover from the power saving mode.

FIG. 12 is a timing chart illustrating an operation for allowing the power controller 17 to recover from the power saving mode. First, in order to recover from the power saving mode, the host apparatus 2 sets the signal PSM to a low level.

In response to the signal PSM having a low level, the power controller 17 sets the signal PW_OFF to a high level and, subsequently, sets the signal STATUS1 to a high level. In response to the signal PW_OFF having a high level, the power supply unit 15 starts supplying the power to the storage controller 11 and the nonvolatile memory 13.

The storage controller 11 recognizes that this power supplying leads to the recovering from the power saving mode by checking that the signal STATUS1 is in a high level. As a result, the storage controller 11 and the nonvolatile memory 13 are in the state where the storage controller 11 and the nonvolatile memory 13 can be operated.

Next, the storage controller 11 performs a recovery process (i.e., a starting process). The recovery process includes resetting (i.e., initializing) of circuits in the storage controller 11, resetting of the nonvolatile memory 13, and resetting of the volatile memory 14.

In the embodiment, the storage controller 11 can fast start the system by using start program data included in the first data retained in the first area 21a of the volatile memory 14.

Figure 13:
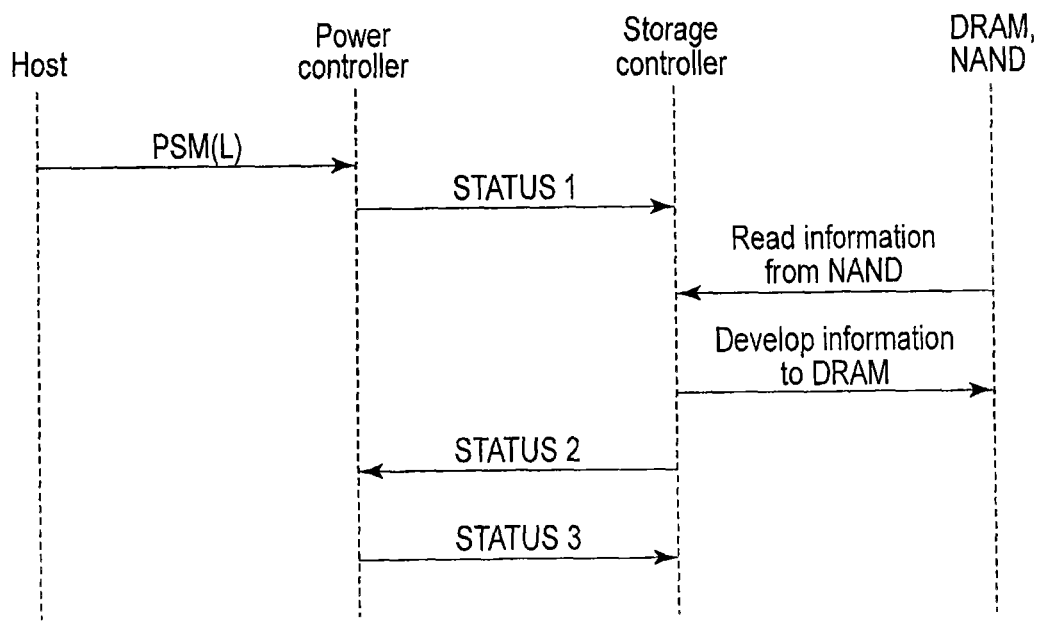
FIG. 13 is an exemplary diagram illustrating a recovery operation of the storage controller illustrated in FIG. 1.

In addition, as illustrated in FIG. 13, in the recovery process, the storage controller 11 reads the management information from the nonvolatile memory 13 and develops the management information in the volatile memory 14. In addition, in the recovery process, the storage controller 11 reads the configuration information of the semiconductor device 1 from the nonvolatile memory 13 and/or the volatile memory 14. By using the configuration information, the semiconductor device 1 can recover to the setting state before the power saving mode.

When the recovering from the power-off state is completed, the storage controller 11 outputs a pulse as the signal STATUS2. In response to the signal STATUS2 formed with a pulse, the power controller 17 sets the signal STATUS3 to a high level. The storage controller 11 recognizes the transitioning to the normal mode based on the signal STATUS3 having a high level.

4. Example of Configuration of Power Supply Unit 15

FIG. 14 is a block diagram illustrating an example of a configuration of the power supply unit 15. The power supply unit 15 includes a first power supply 15a (power 1), a second power supply 15b (power 2), and a third power supply 15c (power 3). The first power supply 15a supplies various types of power to the power controller 17. The second power supply 15b supplies various types of power to the storage controller 11 and supplies a power-on reset signal POR to the storage controller 11. In response to the power-on reset signal POR, the storage controller 11 performs a reset operation. The third power supply 15c supplies, power for, for example, the volatile memory 14.

5. Effect

In the embodiment, in the case where the request for transitioning to the power saving mode is received from the host apparatus 2, the power controller 17 and power supply unit 15 disconnect the power supplied to the storage controller 11 in addition to the nonvolatile memory 13. Therefore, since the semiconductor device 1 can be set to a super power saving state, it is possible to reduce the power consumption of the semiconductor device 1.

In addition, before transitioning to the power saving mode, the power controller 17 issues a power-off warning message to the storage controller 11. Therefore, the storage controller 11 can perform a preparation process for power-off. In other words, the storage controller 11 transfers the management information developed in the volatile memory 14 to the first area 21a of the volatile memory 14 or the nonvolatile memory 13. Therefore, even after the recovering from the power saving mode, the storage controller 11 can be normally operated.

In addition, the power controller 17 transmits a signal indicating whether this power supplying leads to the recovering from the power saving mode or the power supplying to the semiconductor device 1 to the storage controller 11. Therefore, the storage controller 11 determines the recovering from the power saving mode or the power supplying to the semiconductor device 1.

(Effect of Control of Volatile Memory 14)

In the embodiment, when the semiconductor device 1 receives a request for stopping power supplying to the nonvolatile memory 13, the storage controller 11 transitions a portion of the areas of the volatile memory 14 to the self-refresh mode. Therefore, it is possible to reduce the current consumption of the volatile memory 14 in the power saving mode.

In the embodiment, the storage controller 11 transitions the first area 21a of the volatile memory 14 to the self-refresh mode and does not perform refreshing of the second areas 21b, 21c, and 21d. Therefore, it is possible to reduce the current consumption necessary for the refreshing of the second areas 21b, 21c, and 21d.

FIG. 15 is a diagram illustrating an example of current consumption of the volatile memory according to the first embodiment. FIG. 15 illustrates a relationship between the number of self-refreshing blocks (a ratio to a total capacity) and the current consumption in two-power (VDD1 and VDD2) DRAM. As illustrated in FIG. 15, it can be understood that the current consumption is reduced as the number of self-refreshing blocks is decreased.

In the embodiment, before the refreshing of the second areas 21b, 21c, and 21d is stopped, the storage controller 11 transfers at least a part of the data in the second areas 21b, 21c, and 21d to the first area 21a. Therefore, it is possible to avoid losing the necessary data.

In the embodiment, the first area 21a retains at least a part of the start program of the storage controller 11 in the power saving mode. When the request for recovering from the power saving mode is received, the storage controller 11 is started by using the start program described above. Therefore, in comparison with the case where the storage controller 11 is started by reading a whole part of the start program of the storage controller 11 from the nonvolatile memory 13 and using the whole part of the start program, it is possible to fast recover for the semiconductor device 1 to the normal mode. Accordingly, it is possible to shorten the recovery time taken for recovering from the power saving mode.

In the embodiment, the power supply unit 15 is supplied with the power from the host apparatus 2 and supplies the power to the nonvolatile memory 13, the volatile memory 14, and the storage controller 11. The power controller 17 is supplied with the power from the host apparatus 2 and controls the power supply unit 15. The storage controller 11 transitions the first area 21a of the volatile memory 14 to the self-refresh mode and transmits the request to the volatile memory 14 for not performing the refreshing of the second areas 21b, 21c, and 21d. After that, the storage controller 11 transmits a signal to the power controller 17. The power controller 17 receives the signal from the storage controller 11 and transmits the request to the power supply unit 15 for disconnecting power supplied to the nonvolatile memory 13 and the storage controller 11. According to the configuration, in the semiconductor device 1, it is possible to reduce the current consumption of the volatile memory 14 in the power saving mode where the storage controller 11 is stopped in addition to the nonvolatile memory 13. Therefore, it is possible to further reduce the current consumption in the power saving mode of the semiconductor device 1.

In the embodiment, before the refreshing of the second areas 21b, 21c, and 21d is stopped, the storage controller 11 transfers at least a part of the first data in the second areas 21b, 21c, and 21d to the first area 21a. After that, the storage controller 11 transmits the signal to the power controller 17. The first data includes the management information of the nonvolatile memory 13. Therefore, it is possible to securely retain the management information of the nonvolatile memory 13.

Second Embodiment

Next, a semiconductor device 1 according to a second embodiment will be described with reference to FIGS. 16 and 17. The components having the same or similar functions as those of the components of the first embodiment are denoted by the same reference numerals, and the description thereof is omitted. The configurations other than the configuration described below are the same as those of the first embodiment.

In the first embodiment, the storage controller 11 and the power controller 17 are configured with separate IC chips, and the two IC chips are connected through ports and signal lines. In the second embodiment, a power controller 17 is combined into a storage controller 61, and the storage controller 11 and the power controller 17 described in the first embodiment are configured to be included in one IC chip.

Figure 16:
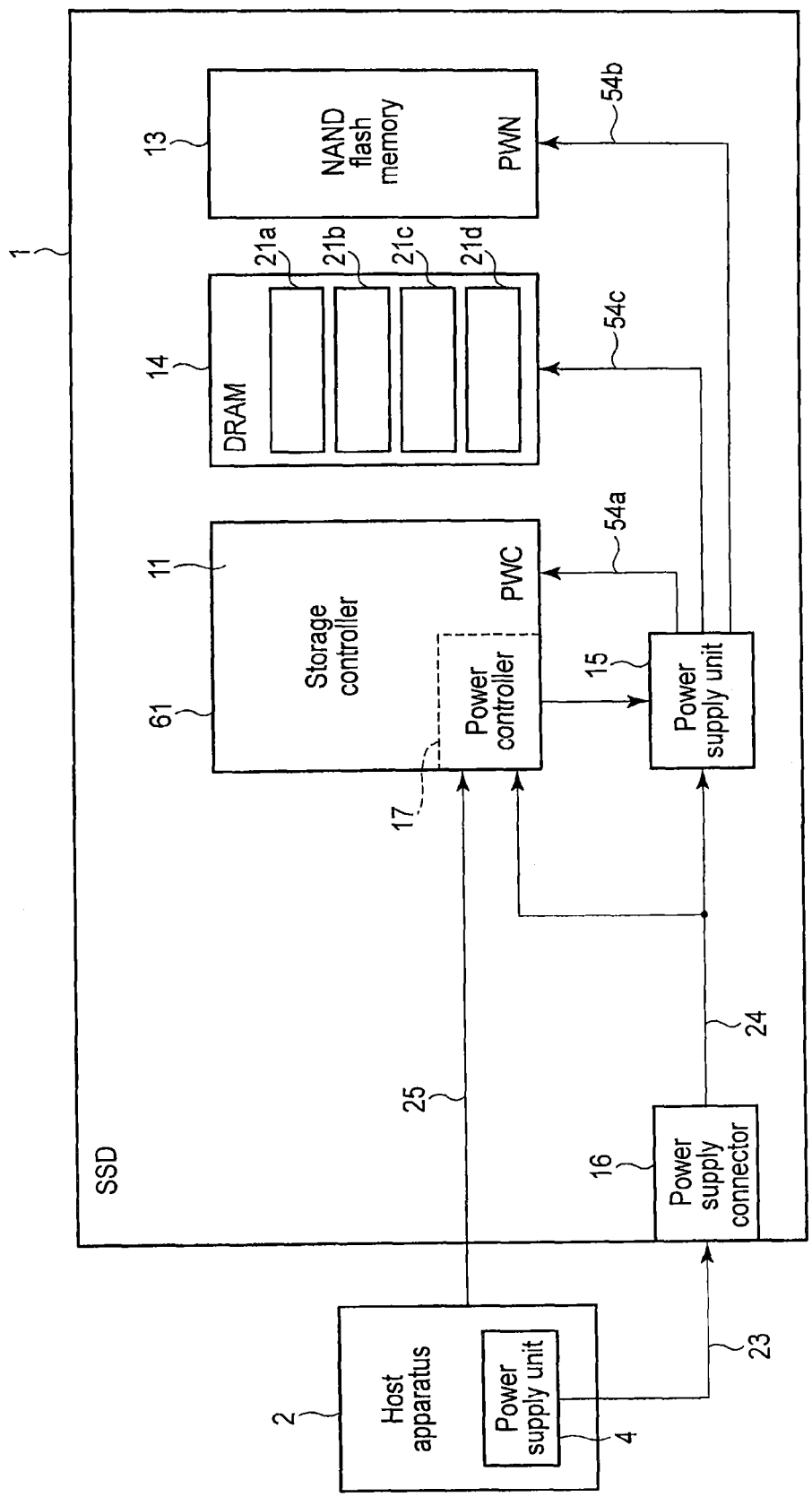
FIG. 16 is an exemplary block diagram illustrating a semiconductor device according to a second embodiment.

FIG. 16 is a block diagram illustrating the semiconductor device 1 according to the second embodiment. As illustrated in FIG. 16, the power controller 17 is included in a storage controller 61, and the storage controller 61 includes the power controller 17 and a controller 11 which controls the power controller 17 which performs control other than the power control. The controller 11 is an example of a "first controller". The power controller 17 is an example of a "second controller".

The storage controller 61 is configured with one IC chip including the controller 11 and the power controller 17. The controller 11 performs the same operations as those of the storage controller 11 described in the first embodiment. The power controller 17 performs the same operations as those of the power controller 17 described in the first embodiment.

In the power saving mode period, although the controller 11 is powered off, the power controller 17 needs to be powered on. Therefore, in the storage controller 61, the power controller 17 and the other controller 11 are separately powered (i.e., the power are configured with the separate systems). The power controller 17 is electrically connected through a power supply line 24 to the power supply connector 16, and the power controller 17 is electrically connected through a signal line 25 to the host apparatus 2. The operations between the power controller 17 and the controller 11 in the power saving mode are the same as the operations between the power controller 17 and the storage controller 11 described in the first embodiment.

Figure 17:
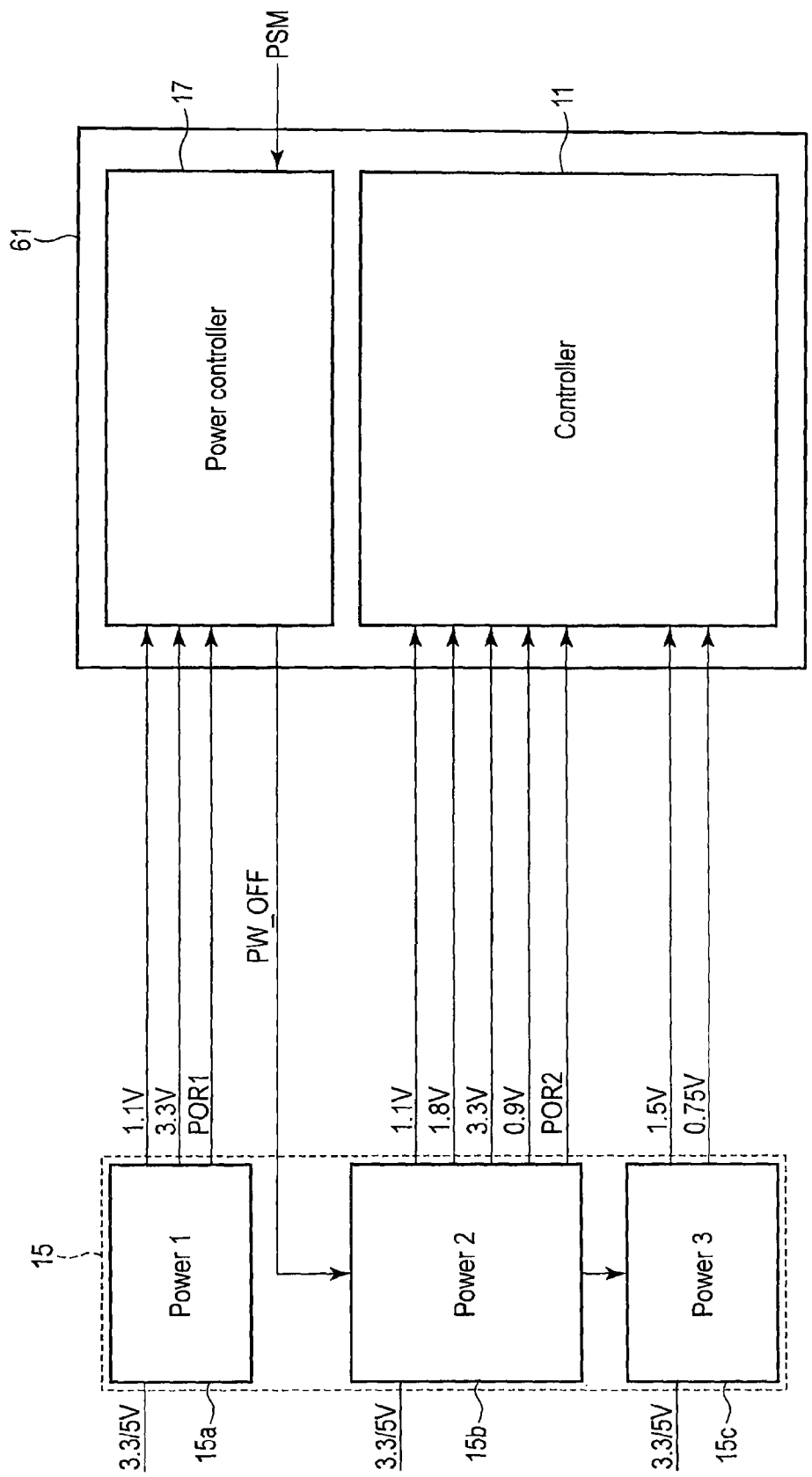
FIG. 17 is an exemplary block diagram illustrating an example of a configuration of a power supply unit according to the second embodiment.

FIG. 17 is a block diagram illustrating an example of a configuration of the power supply unit 15. The power supply unit 15 is configured to include a first power supply 15a (power 1), a second power supply 15b (power 2), and a third power supply 15c (power 3). The first power supply 15a supplies various types of power to the power controller 17 and supplies a power-on reset signal POR1 to the power controller 17. In response to the power-on reset signal POR1, the power controller 17 performs a reset operation. The second power supply 15b supplies various types of power to the controller 11 and supplies a power-on reset signal POR2 to the controller 11. In response to the power-on reset signal POR2, the controller 11 performs a reset operation. The third power supply 15c supplies power for, for example, the volatile memory 14.

According to the second embodiment, the function of the power controller 17 described in the first embodiment can be added to the storage controller 61. Therefore, it is possible to implement the same functions of the first embodiment at lower cost than the case where a separate IC chip is installed as a power controller 17.

Third Embodiment

Next, an electronic apparatus 71 according to a third embodiment will be described with reference to FIGS. 18 to 20. The components having the same or similar functions as those of the components of the first embodiment are denoted by the same reference numerals, and the description thereof is omitted. The configurations other than the configuration described below are the same as those of the first embodiment.

Figure 18:
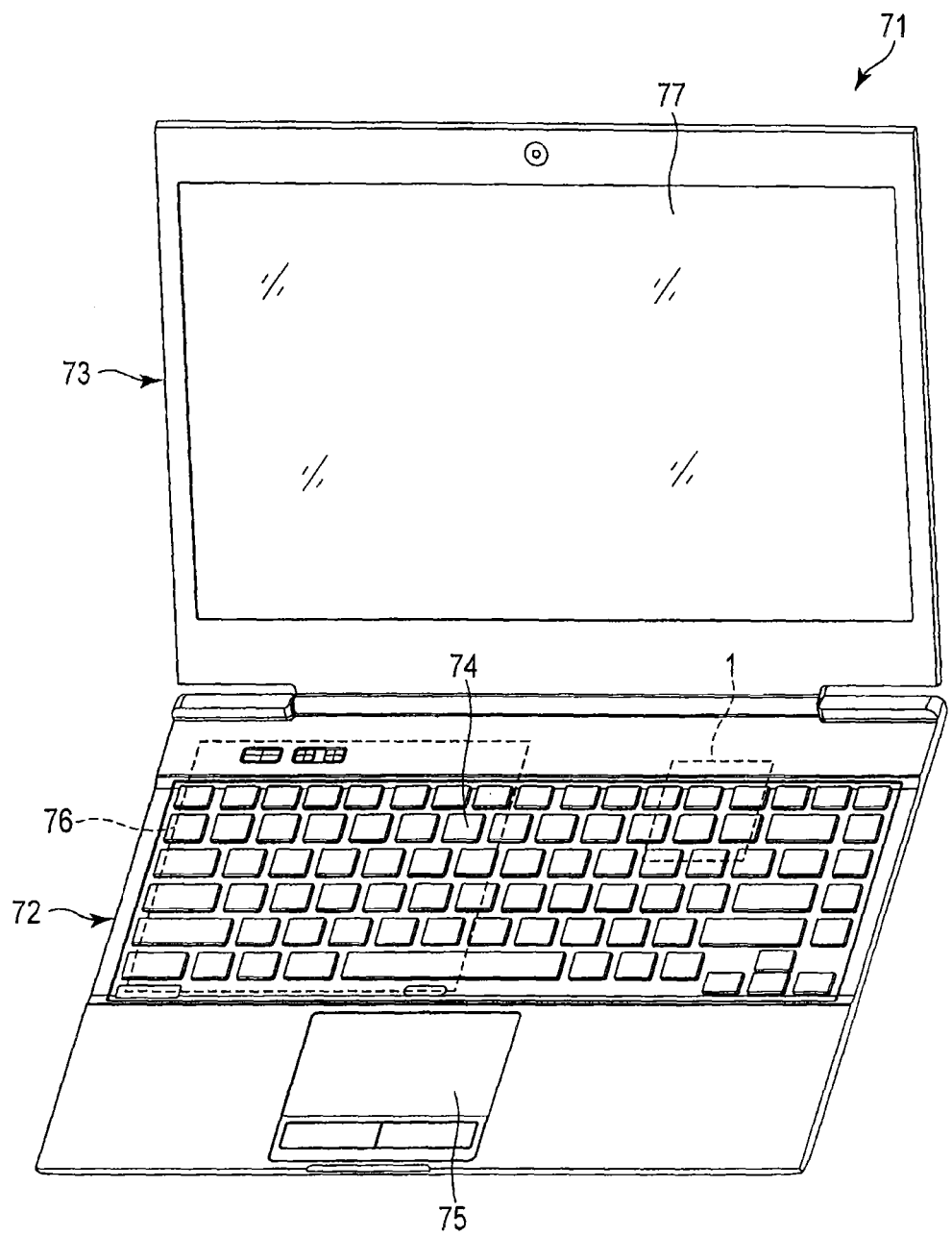
FIG. 18 is an exemplary perspective diagram illustrating an example of an electronic apparatus according to a third embodiment.

As illustrated in FIG. 18, the electronic apparatus 71 according to the embodiment is, for example, a notebook type personal computer (notebook PC). The electronic apparatus 71 is an example of a "host apparatus" which performs the same operations as those of the host apparatus 2 described in the first embodiment. In addition, the electronic apparatus 71 is not limited to the notebook PC, but various types of electronic apparatuses such as a tablet terminal, a television set, a mobile phone (including a smart phone) may be employed.

The electronic apparatus 71 includes a first casing 72 and a second casing 73. A keyboard 74 and a touch pad 75 as a pointing device are provided on the first casing 72. In addition, a circuit board 76 is contained in the first casing 72. A controller 3 of the electronic apparatus 71 is configured with, for example, a portion or a whole portion of the circuit board 76. On the other hand, a display apparatus 77 is contained in the second casing 73.

The semiconductor device 1 according to the embodiment is, for example, an SSD contained in the first casing 72. In addition, the semiconductor device 1 may be mounted in an inner portion of the electronic apparatus 71, or the semiconductor device 1 may be an additional device which is connected to an interface of the electronic apparatus 71.

Figure 19:
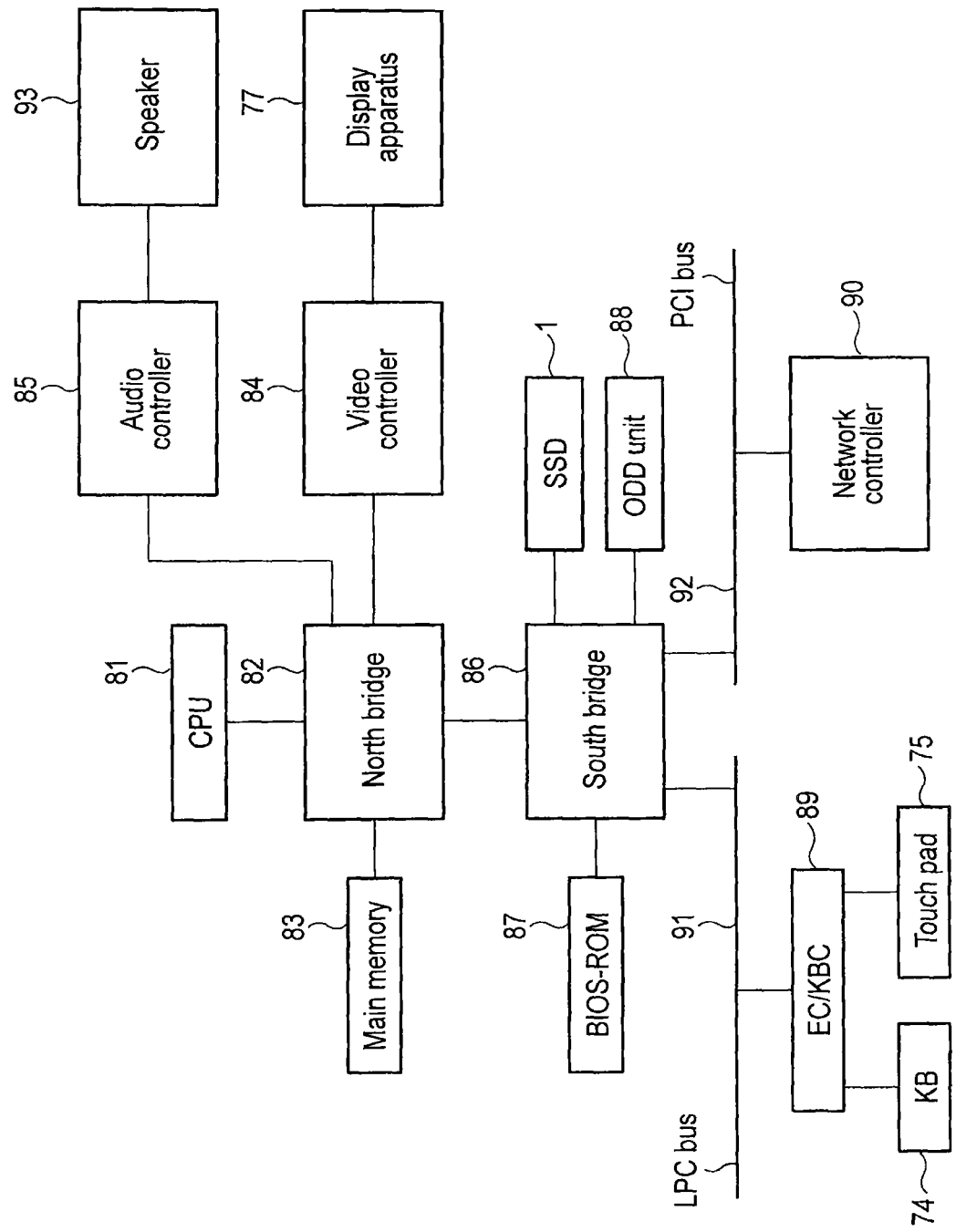
FIG. 19 is an exemplary block diagram illustrating a configuration of the electronic apparatus illustrated in FIG. 18.

FIG. 19 is a block diagram illustrating an example of a configuration of a system of the electronic apparatus 71. The electronic apparatus 71 is configured to include a CPU 81, a north bridge 82, a main memory 83, a video controller 84, an audio controller 85, a south bridge 86, a BIOS-ROM 87, a semiconductor device 1, an ODD (Optical Disk Device) unit 88, an embedded controller/keyboard controller IC (EC/KBC) 89, a network controller 90, and the like.

The CPU 81 is a processor which is installed to control operations of the electronic apparatus 71. The CPU 81 executes an operating system (OS) loaded on the main memory 83 from the semiconductor device 1. In addition, when the ODD unit 88 can execute at least one of the reading process and the writing process with respect to a mounted optical disk, the CPU 81 executes the process. In addition, the CPU 81 also executes a system BIOS (Basic Input Output System) stored in the BIOS-ROM 87. In addition, the system BIOS is a program for controlling hardware in the electronic apparatus 71.

The north bridge 82 is a bridge device for connecting a local bus of the CPU 81 and the south bridge 86. The north bridge 82 is also embedded with a memory controller which controls access to the main memory 83. In addition, the north bridge 82 also has a function of executing communication with the video controller 84 and communication with the audio controller 85 through an AGP (Accelerated Graphics Port) bus or the like.

The main memory 83 temporarily stores programs or data to function as a work area of the CPU 81. The main memory 83 is configured with, for example, a RAM. The video controller 84 is a video play controller which controls the display apparatus 77 used as a display monitor of the electronic apparatus 71. The audio controller 85 is an audio play controller which controls a speaker 93 of the electronic apparatus 71.

The south bridge 86 controls, for example, devices on an LPC (Low Pin Count) bus 91 and, for example, devices on a PCI (Peripheral Component Interconnect) bus 92. In addition, the south bridge 86 controls the semiconductor device 1, which is a storage device storing various types of software and data, through an ATA interface. The electronic apparatus 71 performs access to the semiconductor device 1 in units of a sector. A write command, a read command, a cache flush command, or the like is input to the semiconductor device 1 through the ATA interface. In addition, the south bridge 86 also has a function of controlling access to the BIOS-ROM 87 and the ODD unit 88.

The EC/KBC 89 is a one-chip microcomputer where an embedded controller for managing power and a keyboard controller for controlling the keyboard (KB) 74 and the touch pad 75 are integrated. The EC/KBC 89 has a function of allowing the electronic apparatus 71 to be powered on/off according to user's manipulation of a power button. The network controller 90 is a communication apparatus which executes communication with an external network such as the Internet.

The host apparatus 2 according to the embodiment includes a sleep mode. In the case where the host apparatus 2 is transitioned to the sleep mode, power consumption of the host apparatus 2 can be reduced by setting the semiconductor device 1 to the power saving mode. In the embodiment, before the host apparatus 2 is transitioned to the sleep mode, the host apparatus 2 allows the semiconductor device 1 to be transitioned to the power saving mode.

FIG. 20 is a timing chart illustrating a sleep mode operation of the host apparatus 2 according to the embodiment. Before the host apparatus 2 is transitioned from the normal mode (active mode) to the sleep mode, the host apparatus 2 allows the semiconductor device 1 to be transitioned to the power saving mode. Therefore, before the host apparatus 2 is transitioned to the sleep mode, the host apparatus 2 sets the signal PSM to a high level.

In response to the signal PSM having a high level, the semiconductor device 1 performs the operation for transitioning to the power saving mode as described above. Therefore, the semiconductor device 1 is transitioned to the power saving mode. After that, the host apparatus 2 is transitioned to the sleep mode.

In addition, after the host apparatus 2 recovers from the sleep mode to the normal mode, the host apparatus 2 controls the semiconductor device 1 to recover from the power saving mode to the normal mode. Therefore, after the host apparatus 2 recovers from the normal mode, the host apparatus 2 sets the signal PSM to a low level. In response to the signal PSM having a low level, the semiconductor device 1 performs the operation for recovering from the power saving mode as described above. Therefore, the semiconductor device 1 is transitioned to the normal mode.

According to the embodiment, the sleep mode of the host apparatus 2 and the power saving mode of the semiconductor device 1 can be cooperatively used in an optimal state. In addition, in the sleep mode period, the host apparatus 2 can set the semiconductor device 1 to the power saving mode. Therefore, it is possible to reduce the power consumption of the host apparatus 2.

Fourth Embodiment

Next, a server 101 according to a fourth embodiment will be described with reference to FIG. 21. The components having the same or similar functions as those of the components of the first embodiment are denoted by the same reference numerals, and the description thereof is omitted. The configurations other than the configuration described below are the same as those of the first embodiment.

Figure 21:
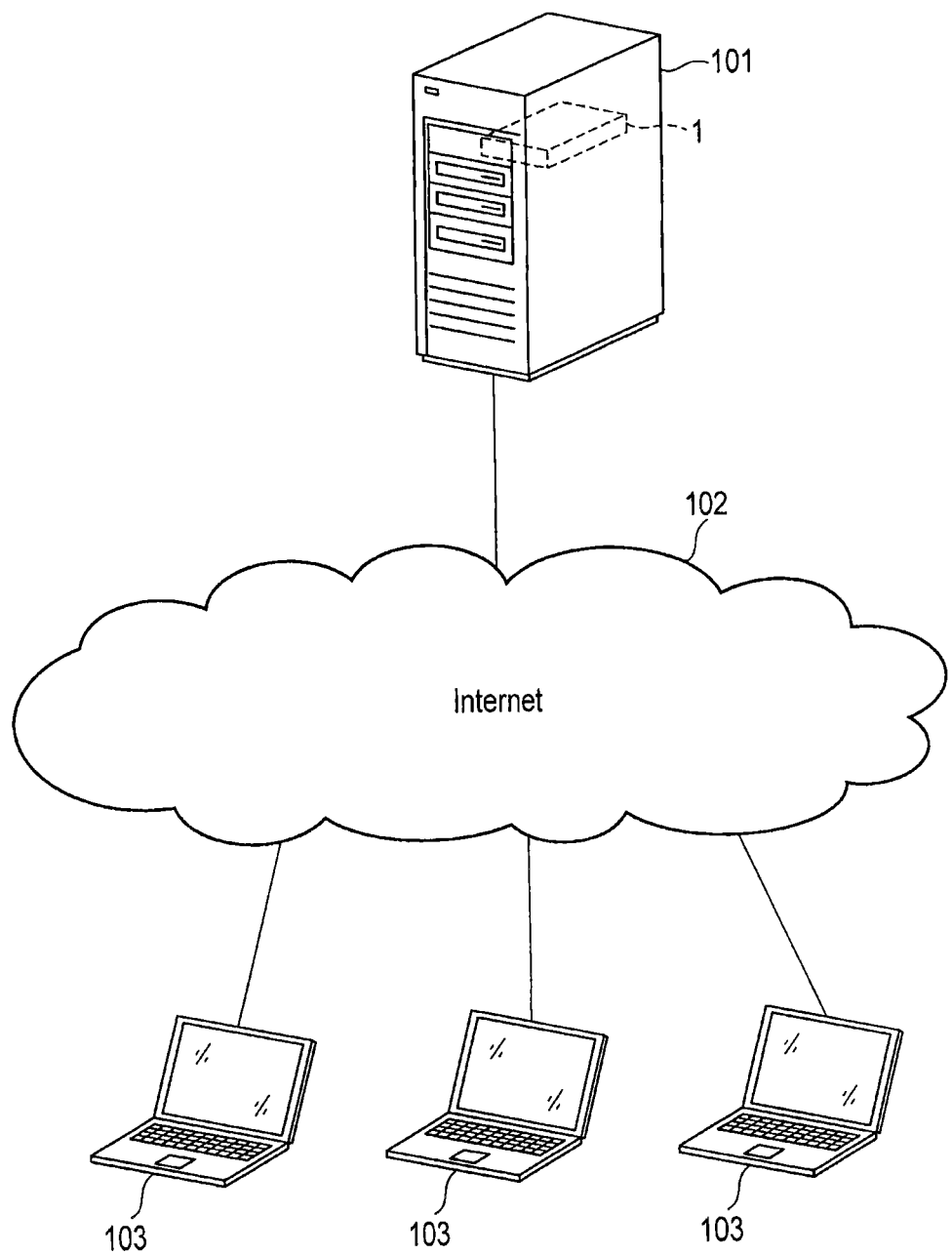
FIG. 21 is an exemplary diagram illustrating a server including a semiconductor device according to a fourth embodiment.

As illustrated in FIG. 21, the server 101 according to the embodiment is an example of a "host apparatus", which performs the same operations as those of the host apparatus 2 described in the first embodiment. The server 101 includes a semiconductor device 1 for storing data. The semiconductor device 1 is, for example, an SSD. The server 101 is connected to a network 102 (e.g., the Internet). Besides the server 101, a plurality of clients 103 (e.g., personal computers) which are supplied with information and functions of the server 101 are connected to the network 102.

The server 101 may supply files or data stored in the semiconductor device 1 to the clients 103 or supply the functions thereof to a client 402. In addition, the server 101 according to the embodiment performs the same operations as those of the host apparatus 2 described according to the first embodiment.

According to the configurations of the first to fourth embodiments described above, it is possible to reduce the power consumption of the semiconductor device 1. This leads to the reduction in power consumption of the electronic apparatus 71 or the server 101 where the semiconductor device 1 is installed.

The embodiments are not limited to the embodiments described above. For example, the components according to the embodiments may be appropriately exchanged or combined. For example, the semiconductor devices 1 according to the third and fourth embodiments are not limited to the components according to the first embodiment, but the components according to the second embodiment may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a nonvolatile memory;
a volatile memory comprising a first area and a second area;
a first controller configured to control the nonvolatile memory and the volatile memory;

a power supply unit configured to be supplied with power from a host apparatus and to supply power to the nonvolatile memory, the volatile memory, and the first controller; and a second controller configured to be supplied with power from the host apparatus and to control the power supply unit, wherein when a request for transitioning from a first mode to a second mode in which power consumption is smaller than that in the first mode is received, the first controller transitions the first area of the volatile memory to a self-refresh mode and transmits a request to the volatile memory to not perform refreshing of the second area, and after that, transmits a signal to the second controller, the second controller receives the signal from the first controller and transmits a request to the power supply unit to disconnect the power supplied to the nonvolatile memory and the first controller, before the refreshing of the second area is stopped, the first controller transfers at least a part of first data in the second area to the first area, and after that, transmits the signal to the second controller, and the first data comprises management information of the nonvolatile memory.

2. The device according to claim 1, wherein the first data further comprises at least a part of a start program of the first controller.

3. The device according to claim 1, wherein the first controller stops refreshing of the second area in a state where the second area comprises second data.

4. The device according to claim 3, wherein the second data comprises information which is readable from the nonvolatile memory.

5. The device according to claim 1, wherein the first controller does not write management information of the nonvolatile memory to the second area of the volatile memory but writes the management information to the first area in the first mode.

6. The device according to claim 1, wherein before the refreshing of the second area is stopped, the first controller writes at least a part of the data of the second area in the nonvolatile memory and, after that, transmits the signal to the second controller.

7. The device according to claim 1, wherein the second controller receives a request for recovering from the second mode to the first mode and transmits a request to the power supply unit to supply power to the nonvolatile memory and the first controller.

8. A semiconductor device comprising:
a nonvolatile memory;
a volatile memory comprising a first area and a second area;
a first controller configured to control the nonvolatile memory and the volatile memory;
a power supply unit configured to be supplied with power from a host apparatus and to supply power to the nonvolatile memory, the volatile memory, and the first controller; and
a second controller configured to be supplied with power from the host apparatus and to control the power supply unit, wherein when a request for transitioning from a first mode to a second mode in which power consumption is smaller than that in the first mode is received, the first controller transitions the first area of the volatile memory to a self-refresh mode and transmits a request to the volatile memory to not perform refreshing of the second area, and after that, transmits a signal to the second controller, the second controller receives the signal from the first controller and transmits a request to the power supply unit to disconnect the power supplied to the nonvolatile memory and the first controller, and the first controller does not write management information of the nonvolatile memory to the second area of the volatile memory but writes the management information to the first area in the first mode.

* * * * *